US011393517B2

(12) United States Patent
Kim et al.

(10) Patent No.: US 11,393,517 B2
(45) Date of Patent: *Jul. 19, 2022

(54) APPARATUS AND METHODS FOR WRITING RANDOM ACCESS MEMORIES

(71) Applicant: WESTERN DIGITAL TECHNOLOGIES, INC., San Jose, CA (US)

(72) Inventors: Yongjune Kim, San Jose, CA (US); Yoocharn Jeon, Palo Alto, CA (US); Won Ho Choi, Santa Clara, CA (US); Cyril Guyot, San Jose, CA (US); Yuval Cassuto, Haifa (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/319,991

(22) Filed: May 13, 2021

(65) Prior Publication Data
US 2021/0264958 A1 Aug. 26, 2021

Related U.S. Application Data

(63) Continuation of application No. 16/586,899, filed on Sep. 27, 2019, now Pat. No. 11,031,061.

(51) Int. Cl.
*G11C 11/16* (2006.01)
*G06F 12/02* (2006.01)

(52) U.S. Cl.
CPC ...... *G11C 11/1675* (2013.01); *G06F 12/0238* (2013.01); *G11C 11/161* (2013.01); *G11C 11/1655* (2013.01); *G11C 11/1657* (2013.01)

(58) Field of Classification Search
CPC .............. G11C 11/1675; G11C 11/161; G11C 11/1655; G11C 11/1657; G06F 12/0238
See application file for complete search history.

(56) References Cited

U.S. PATENT DOCUMENTS

| 6,591,394 | B2 | 7/2003 | Lee et al. |
| 9,818,440 | B1 | 11/2017 | Jubert et al. |
| 10,741,251 | B2* | 8/2020 | Dunga ............... G11C 16/0483 |
| 2004/0012994 | A1 | 1/2004 | Slaughter et al. |
| 2011/0273926 | A1 | 11/2011 | Wu et al. |
| 2013/0301335 | A1* | 11/2013 | Ong ....................... G11C 29/12 365/148 |
| 2014/0192583 | A1 | 7/2014 | Rajan et al. |
| 2016/0049195 | A1 | 2/2016 | Yu et al. |
| 2016/0232951 | A1 | 8/2016 | Shanbhag et al. |

(Continued)

OTHER PUBLICATIONS

International Search Report and Written Opinion dated Jul. 6, 2020 in International Patent Application No. PCT/US2020/024159.

(Continued)

*Primary Examiner* — Jerome Leboeuf
(74) *Attorney, Agent, or Firm* — Vierra Magen Marcus LLP

(57) ABSTRACT

An apparatus is provided that includes a memory device including a plurality of sub-arrays, and a memory controller. The memory controller is configured to determine a value of a parameter of a corresponding write pulse for each bit of a word based on a relative importance of each bit, and write each bit of the word to a corresponding one of the plurality of sub-arrays using the corresponding write pulses.

20 Claims, 12 Drawing Sheets

(56) References Cited

U.S. PATENT DOCUMENTS

| | | |
|---|---|---|
| 2016/0276011 A1* | 9/2016 | Houssameddine ........................ G11C 13/0097 |
| 2017/0351449 A1 | 12/2017 | Kim |
| 2018/0130494 A1 | 5/2018 | Chatradhi et al. |
| 2018/0364931 A1* | 12/2018 | Siau ....................... G06F 3/061 |
| 2019/0180807 A1 | 6/2019 | Louie et al. |
| 2019/0214070 A1 | 7/2019 | Janesky et al. |

OTHER PUBLICATIONS

Requirement for Restriction dated Oct. 19, 2020 in U.S. Appl. No. 16/586,899.
Response to Requirement for Restriction dated Nov. 24, 2020 in U.S. Appl. No. 16/586,899.
Office Action dated Dec. 18, 2020 in U.S. Appl. No. 16/586,899.
Response to Office Action dated Mar. 1, 2021 in U.S. Appl. No. 16/586,899.
Notice of Allowance and Fee(s) Due dated Apr. 7, 2021 in U.S. Appl. No. 16/586,899.

* cited by examiner

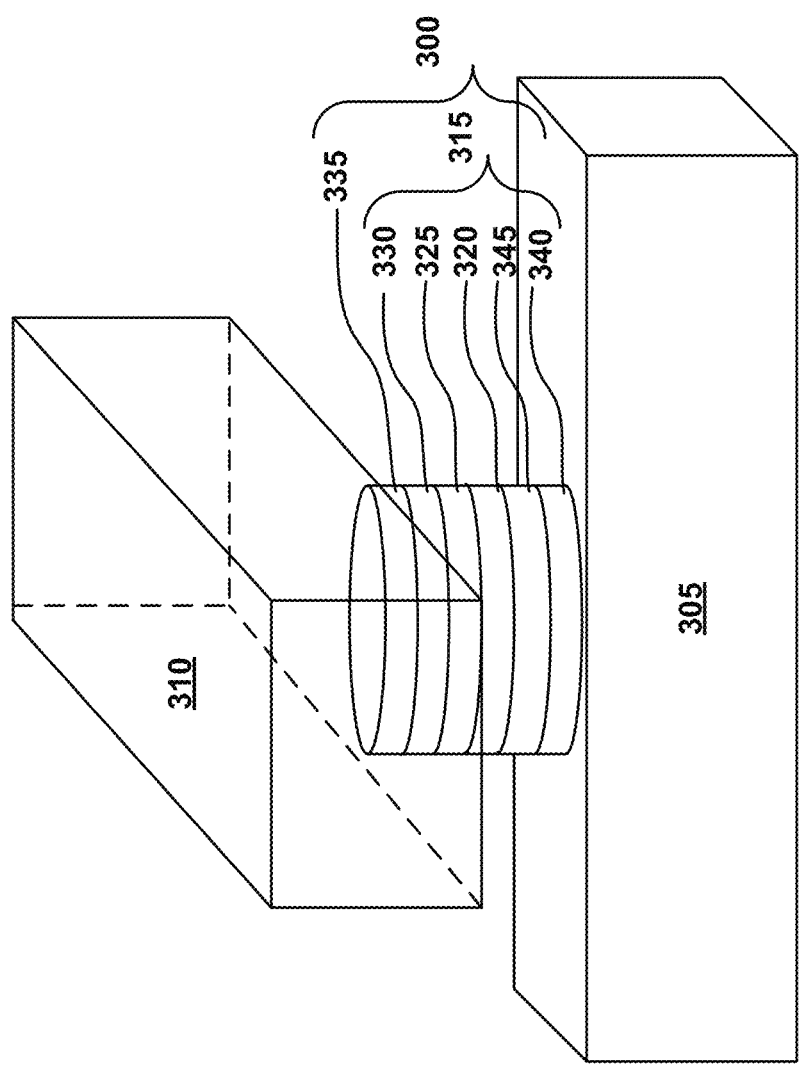

APPARATUS AND METHODS FOR WRITING RANDOM ACCESS MEMORIES

PRIORITY CLAIM

This application is a continuation of U.S. patent application Ser. No. 16/586,899 filed on Sep. 27, 2019, now U.S. Pat. No. 11,031,061, entitled "Improving Write Efficiency In Magneto-Resistive Random Access Memories," which application is incorporated by reference herein in its entirety for all purposes.

BACKGROUND

Applicant provides the following description to assist the understanding of the reader. None of the information provided or references cited is admitted to be prior art.

Memory devices are used in a wide variety of applications for storing data. Magneto-resistive Random Access Memory (MRAM) is one type of memory device that has gained popularity in recent years. However, present day MRAM devices have limitations due to their configuration and the way they operate.

SUMMARY

The systems, methods, and devices of this disclosure each have several innovative aspects, no single one of which is solely responsible for the all of the desirable attributes disclosed herein.

Various aspects of the disclosure will now be described with regard to certain examples and embodiments, which are intended to illustrate but not limit the disclosure. Although the examples and embodiments described herein will focus on, for the purpose of illustration, specific systems and processes, one of skill in the art will appreciate the examples are illustrative only, and are not intended to be limiting.

In accordance with some aspects of the present disclosure, a method is disclosed. The method includes determining, by a memory controller associated with a memory device, a value of a parameter of a write pulse for a plurality of bits of a B-bit word to be stored in the memory device. The value of the parameter is based upon a relative importance of a bit position of the plurality of bits in the B-bit word to a performance of a machine learning or signal processing task involving the B-bit word, a fidelity metric, and a resource metric. The method also includes writing, by the memory controller, each of the plurality of bits of the B-bit word in a different sub-array of the memory device using the write pulse generated based on the value of the parameter determined for a particular one of the plurality of bits.

In accordance with some other aspects of the present disclosure, a system is disclosed. The system includes a memory device having a plurality of sub-arrays. Each of the plurality of sub-arrays stores one bit of a B-bit word. The system also includes a memory controller in operational association with each of the plurality of sub-arrays. The memory controller includes programmed instructions to determine a first write pulse for a most significant bit of the B-bit word and a second write pulse for a least significant bit of the B-bit word. A value of a parameter of the first write pulse is greater than the value of the parameter of the second write pulse, and the values of the parameter of the first write pulse and the second write pulse are determined to minimize a fidelity metric and satisfy a resource metric, and to reflect a relative importance of the most significant bit and the least significant bit to a performance of a machine learning or signal processing task involving the B-bit word. The memory controller further includes programmed instructions to store the most significant bit in a first sub-array of the plurality of sub-arrays based on the first write pulse and store the least significant bit in a second sub-array of the plurality of sub-arrays based on the second write pulse.

In accordance with yet other aspects of the present disclosure, a non-transitory computer-readable medium having computer-readable instructions stored thereon is disclosed. The computer-readable instructions when executed by a processor associated with a magneto-resistive random access memory causes the processor to receive a fidelity metric, a resource metric, and a granularity. The computer-readable instructions also cause the processor to determine a value of a parameter of a write pulse for a plurality of bit positions of a B-bit word to satisfy the granularity and the resource metric while minimizing the fidelity metric, and to reflect a relative importance of the plurality of bit positions to a performance of a machine learning or signal processing task involving the B-bit word. The value of the parameter of the write pulse for a more important bit position is greater than the value of the parameter of the write pulse for a lesser important bit position.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

FIG. 3 is an example block diagram of a portion of the MRAM array of FIGS. 2A-2C showing an MRAM cell in greater detail, in accordance with some embodiments of the present disclosure.

Figure 1:
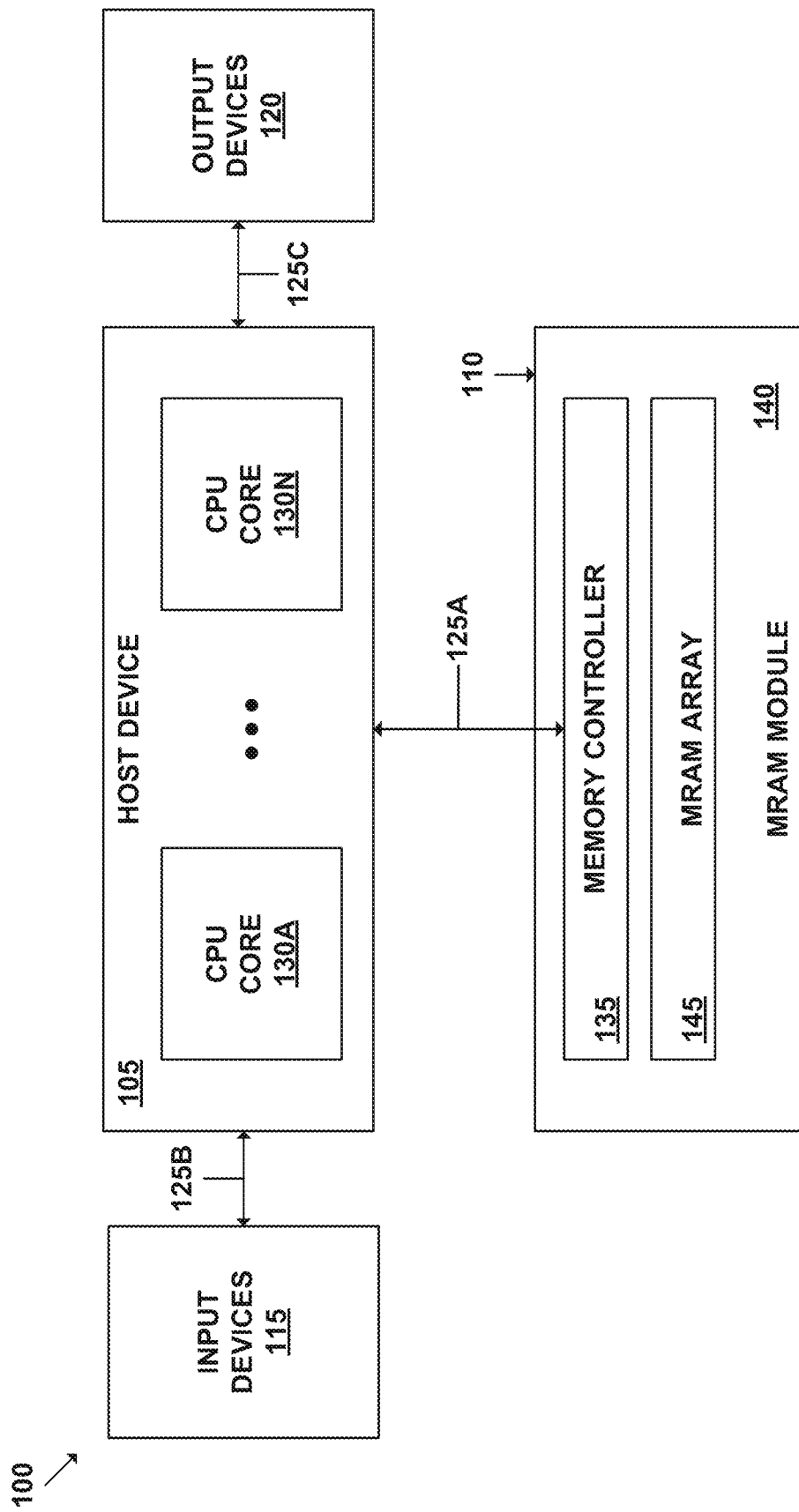
FIG. 1 is an example block diagram of a computing system, in accordance with some embodiments of the present disclosure.

The foregoing and other features of the present disclosure will become apparent from the following description and appended claims, taken in conjunction with the accompanying drawings. Understanding that these drawings depict only several embodiments in accordance with the disclosure and are therefore, not to be considered limiting of its scope, the disclosure will be described with additional specificity and detail through use of the accompanying drawings.

DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

MRAM is a high density, non-volatile memory that stores data in magnetic storage elements. An MRAM array may include a plurality of MRAM cells, with each MRAM cell being configured to store one bit of data. A data bit may be written to an MRAM cell by applying a write pulse that facilitates a change in a magnetic state of the magnetic storage element of the MRAM cell. The write pulse is a function of a magnitude of write current and a length/duration of pulse width. A pulse width may be defined as the time between a rising edge and the next falling edge of a write pulse. Thus, pulse width may be expressed in units of time.

The write current and pulse width of the write pulse impact the Write Error Rate (WER) (also referred to herein as write failure rate) of the MRAM cell. WER may be defined as the probability of a write error in an MRAM cell for a given write pulse. In other words, WER may be defined as the probability that a write error occurs during writing a data bit to an MRAM cell for a given write current and pulse width of the write pulse. A write error may be defined as a failure to write the data bit desired to be written in an MRAM cell. Thus, the WER is also a function of write current and pulse width of the write pulse.

Generally speaking, the WER decreases as the write current increases or as the pulse width increases. Thus, by increasing the magnitude of write current or by using longer/greater duration pulse widths in the write pulse, the WER may be reduced. However, increasing the magnitude of the write current or using longer/greater duration pulse widths increases the write energy or power needed or consumed to write a data bit to an MRAM cell.

Increasing the write energy also may increase the wear and tear on the MRAM cells, and ultimately degrade the endurance of the associated MRAM array. Thus, increasing the write energy uninhibited is undesirable. The present disclosure provides technical solutions for reducing WER, while also reducing the write energy needed/consumed during writing a data bit to an MRAM cell, thereby increasing write efficiency. More specifically, the present disclosure provides a mechanism to determine an optimized write pulse based upon the relative importance of a bit position of data.

For example, in some applications, write errors in a Most Significant Bit (MSB) position of data may cause more harm than write errors in a Least Significant Bit (LSB) position of the data. Thus, the MSB may be considered more important than the LSB in some applications. To reduce write errors in the MSB, and therefore reduce WER of the MSB, the write current and/or pulse width of the write pulse used for writing the MSB bit may be increased.

For example, in some embodiments, a write energy constraint may be defined. The write pulse for the MSB may then be optimized by identifying an optimized write current and/or an optimized pulse width that minimizes WER subject to the write energy constraint. In some embodiments, the write pulses for the LSB and other bit positions also may be optimized. However, by varying the write energy constraint based upon the relative importance of the bit positions, optimized write pulses, and therefore optimized write currents and optimized pulse widths, for those bit positions also may be determined.

In some embodiments, the magnitude of the optimized write current for the more important bit positions (e.g., MSB) may be greater than the magnitude of the optimized write current for the lesser important bit positions (e.g., LSB). Similarly, in some embodiments, the length/duration of the optimized pulse width for the more important bit positions (e.g., MSB) may be greater than the length/duration of the optimized write current for the lesser important bit positions (e.g., LSB). By optimizing write pulses based upon the relative importance of the bit position of data, the WER in the data may be controlled, while achieving a desired write energy. Although the present disclosure is described in terms of write current, the present disclosure is also applicable to write voltages of the write pulse.

For example, in some embodiments, the write pulse may be defined in terms of a write voltage and a pulse width. When the write pulse is defined in terms of a write voltage, an optimal write voltage may be computed, instead of or in addition to computing an optimal write current, based upon the relative importance of the bit positions of data. The formulae below used for write current also may be used for write voltage with the current variable, i, in those formulae replaced with a voltage variable, v. The write current, the pulse width, and write voltage are parameters of the write pulse.

Referring now to FIG. 1, an example block diagram of a computing system 100 is shown, in accordance with some embodiments of the disclosure. The computing system 100 includes a host device 105 associated with a memory device 110. The host device 105 may be configured to receive input from one or more input devices 115 and provide output to one or more output devices 120. Host device 105 may be configured to communicate with memory device 110, input devices 115, and output devices 120 via appropriate interfaces or channels 125A, 125B, and 125C, respectively.

Computing system 100 may be implemented in a variety of computing devices such as computers (e.g., desktop, laptop, etc.), tablets, personal digital assistants, mobile devices, wearable computing devices such as smart watches, other handheld or portable devices, or any other computing unit suitable for performing operations described herein using host device 105.

Input devices 115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with host device 105 and that allows an external source, such as a user, to enter information (e.g., data) into host device 105 and send instructions to host device 105.

Similarly, output devices 120 may include a variety of output technologies such as external memories, printers, speakers, displays, microphones, light emitting diodes, headphones, plotters, speech generating devices, video devices, global positioning systems, and any other output peripherals that are configured to receive information (e.g., data) from host device 105.

The "data" that are either input into host device 105 and/or output from host device 105 may include any of a variety of textual data, graphical data, video data, sound data, position data, combinations thereof, or other types of analog and/or digital data that is suitable for processing using computing system 100.

Host device 105 may include one or more Central Processing Unit (CPU) cores or processors 130A-130N that may be configured to execute instructions for running one or more applications associated with the host device. In some embodiments, the instructions and data needed to run the one or more applications may be stored within memory device 110.

Host device 105 also may be configured to store the results of running the one or more applications within memory device 110. Thus, host device 105 may be configured to request memory device 110 to perform a variety of operations. For example, host device 105 may request memory device 110 to read data, write data, update or delete data, and/or perform management or other operations.

To facilitate communication with memory device 110, host device 105 may communicate with a memory controller 135 of memory device 110. Although memory controller 135 is shown as being part of memory device 110, in some embodiments, memory controller 135 may be part of host device 105 or another element of computing system 100 and operatively associated with host device 105/memory device 110.

Memory controller 135 may be configured as a logical block or circuitry that receives instructions from host device 105 and performs operations in accordance with those instructions. For example, memory controller 135 may be configured to read data from or write data to memory device 110 via interface 125A.

In some embodiments and as shown, memory device 110 may include an MRAM module 140. In some embodiments, MRAM module 140 may be of the type Magneto-electric Random Access Memory (MeRAM) or Spin Transfer-Torque MRAM (STT-MRAM) (also referred to sometimes as STT-RAM, ST-MRAM, ST-RAM, and the like), Spin-Orbit Torque MRAM (SOT-MRAM). In other embodiments, MRAM module 140 may include other types of MRAM.

In some embodiments, memory device 110 may include memory modules other than MRAM module 140 that may benefit from improving a write efficiency as described herein. For example, in some embodiments, memory device 110 may include Dynamic Random Access Memory (DRAM), Resistive Random Access Memory (ReRAM), Static Random Access Memory (SRAM), etc.

In some embodiments, memory device 110 may include MRAM module 140 as well as other types of memories (e.g., such as those discussed above) that may benefit from the operations described herein. Further, although memory device 110 has been shown as having a single memory module (e.g., MRAM module 140), in other embodiments, memory device 110 may be made up of multiple memory modules. For ease of description, MRAM will be used in the description here but the scope of the various embodiments encompasses these other memory types including those mentioned above.

Figure 2A:
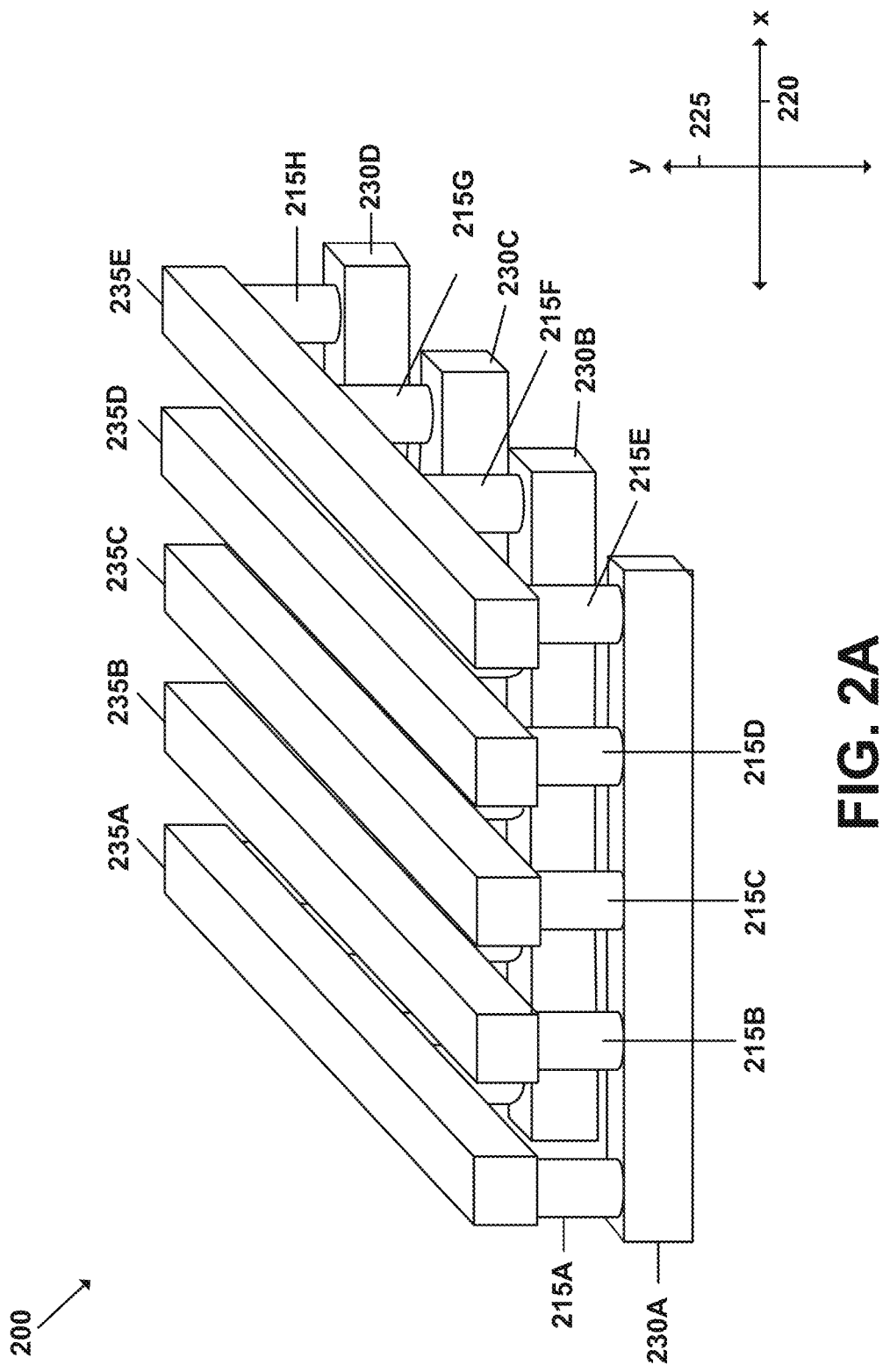
FIG. 2A is an example block diagram of a two-dimensional MRAM array used in a memory device of the computing system of FIG. 1, in accordance with some embodiments of the present disclosure.
Figure 2B:
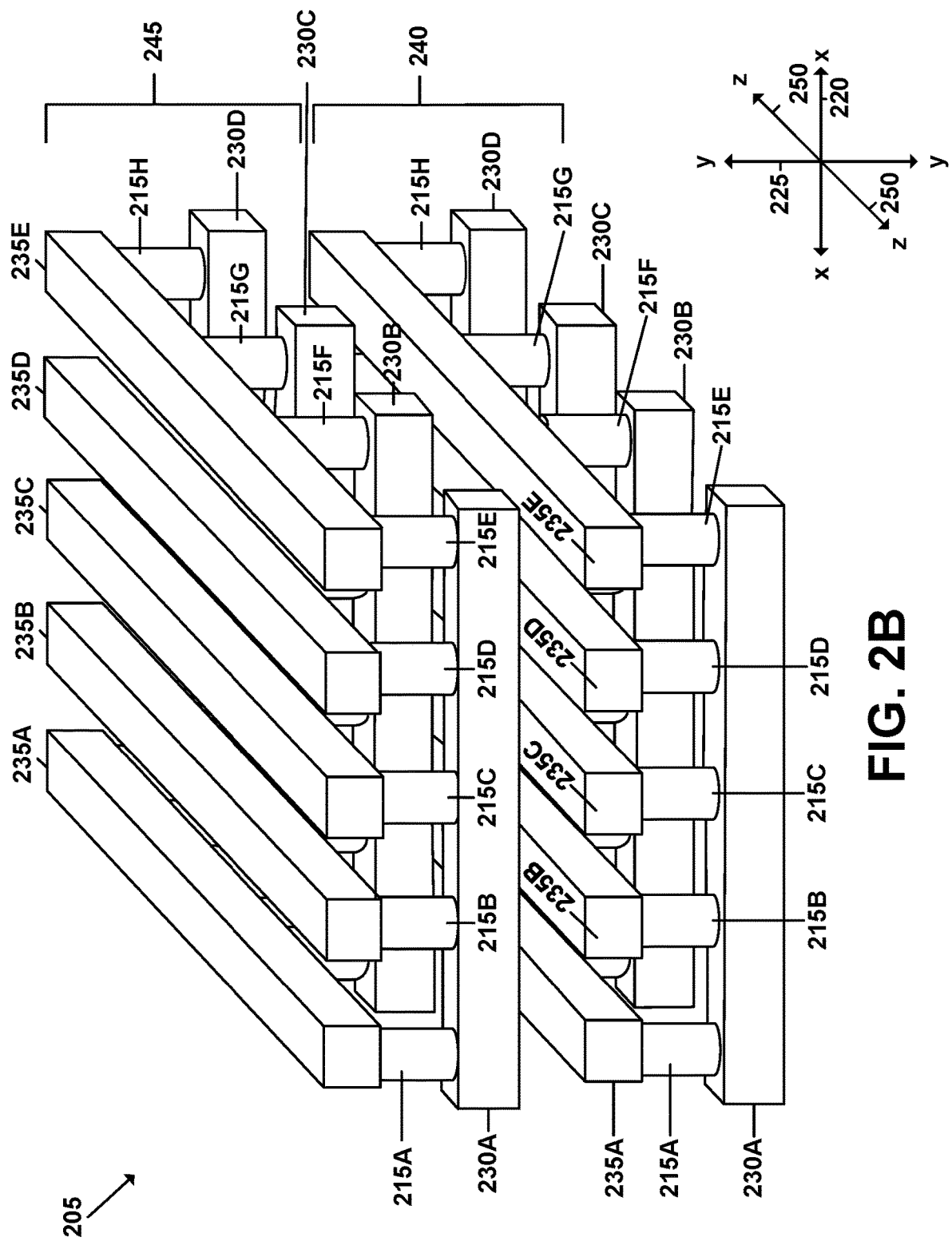
FIG. 2B is an example block diagram of a three-dimensional MRAM array used in a memory device of the computing system of FIG. 1, in accordance with some embodiments of the present disclosure.
Figure 2C:
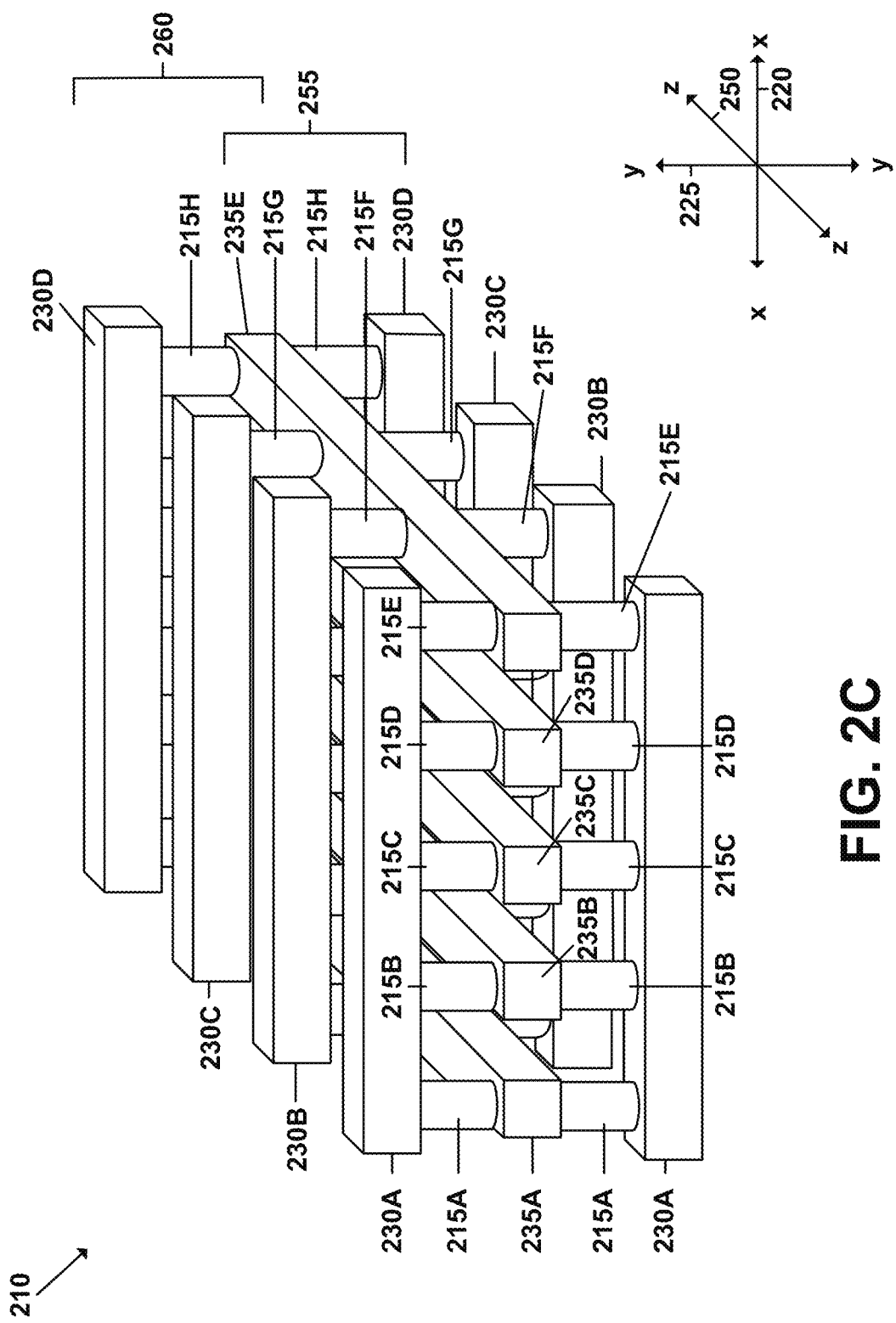
FIG. 2C is another example block diagram of a three-dimensional MRAM array used in a memory device of the computing system of FIG. 1, in accordance with some embodiments of the present disclosure.

MRAM module 140 may include an MRAM array 145. MRAM array 145 may include a plurality of MRAM cells that allow storing of data bits as magnetic states instead of electric charge. FIGS. 2A-2C describe examples of MRAM array 145 in greater detail. Although a single MRAM array 145 has been shown as being part of MRAM module 140, in some embodiments, multiple MRAM arrays may be present within the MRAM module.

It is to be understood that only some components of computing system 100 are shown and described in FIG. 1. However, computing system 100 may include other components such as various batteries and power sources, networking interfaces, routers, switches, external memory systems, controllers, etc. Generally speaking, computing system 100 may include any of a variety of hardware, software, and/or firmware components that are needed or considered desirable in performing the functions described herein.

Similarly, host device 105, input devices 115, output devices 120, and memory device 110 including MRAM module 140 and MRAM array 145, may include other hardware, software, and/or firmware components that are considered necessary or desirable in performing the functions described herein. In addition, in some embodiments, memory device 110 may integrate some or all of the components of host device 105, including, for example, CPU cores 130A-130N, and those CPU cores may implement the write pulse determination and related control as described herein.

Turning now to FIGS. 2A-2C, example configurations of an MRAM array are shown, in accordance with some embodiments of the present disclosure. For example, FIG. 2A shows an example MRAM array 200, FIG. 2B shows an example MRAM array 205, and FIG. 2C shows an example MRAM array 210. MRAM arrays 200-210 are analogous to the MRAM array 145 of FIG. 1.

Referring specifically to FIG. 2A, MRAM array 200 is a two-dimensional memory array having a plurality of MRAM cells 215A-215H extending in x-direction 220 and y-direction 225, and forming a two-dimensional array of MRAM cells. Although nine of the plurality of MRAM cells 215A-215H are shown in MRAM array 200, it is to be understood that the number of MRAM cells in the x-direction 220 and in the y-direction 225 may vary from that shown depending upon the capacity of the MRAM array that is desired.

MRAM array 200 also includes a plurality of word lines 230A-230D, only four of which are shown in FIG. 2A. Depending upon the number of the plurality of MRAM cells 215A-215H, the number of the plurality of word lines 220A-220D may vary. Generally speaking, one of the plurality of word lines 230A-230D may be provided for each row of the plurality of MRAM cells 215A-215H, as shown in FIG. 2A.

A "row" as used herein means a horizontal line extending in the x-direction 220. Thus, for example, the plurality of MRAM cells 215A, 215B, 215C, and 215D may be considered to be in one "row," and are connected to and share the word line 230A. Similarly, the plurality of MRAM cells in the same row as MRAM cell 215F are connected to and share the word line 230B, and so on.

MRAM array 200 also includes a plurality of bit lines 235A-235E. The plurality of bit lines 235A-235E run perpendicular (or substantially perpendicular) to the plurality of word lines 230A-230D. Similar to the plurality of word lines 230A-230D, the number of the plurality of bit lines 235A-235E varies depending upon the number of the plurality of MRAM cells 215A-215H in MRAM array 200. Generally speaking, one of the plurality of bit lines 235A-235E may be provided for each "column" of the plurality of MRAM cells 215, as shown in FIG. 2A.

A "column" as used herein means a vertical line extending in the y-direction 225. Thus, for example, the plurality of MRAM cells 215E, 215F, 215G, and 215H may be considered to be in one "column," and may be connected to and share bit line 235E. Similarly, the plurality of MRAM cells in the same column as MRAM cell 215D may be connected to and share bit lines 235D, and so on.

Thus, memory array 200 includes the plurality of word lines 230A-230D and the plurality of bit lines 235A-235E arranged in a crisscross or cross point configuration. Each of the plurality of word lines 230A-230D and each of the plurality of bit lines 235A-235E is a conductor or conductive line that may be used to select the associated one of the plurality of MRAM cells 215A-215H. Further, each of the plurality of word lines 230A-230D may be offset from a neighboring word line to define a spacing therebetween. Similarly, each of the plurality of bit lines 235A-235E may be offset from a neighboring bit line to define a spacing therebetween in the x-direction 220.

Each of the plurality of MRAM cells 215A-215H is located at an intersection region or intersection point of one of the plurality of word lines 230A-230D and one of the plurality of bit lines 235A-235E. For example, MRAM cell 215A is located at the intersection of, and connected to, word line 230A and bit line 235A.

Similarly, MRAM cell 215B is located at the intersection of, and connected to, word line 230A and bit line 235B, and so on. Since the plurality of word lines 230A-230D and the plurality of bit lines 235A-235E are offset from each other to define the spacing discussed above, each of the plurality of MRAM cells 215A-215H is also offset from a neighboring MRAM cell.

Instead of the two-dimensional array of MRAM array 200, MRAM arrays 205 and 210 are three-dimensional in nature. For example, in some embodiments, MRAM arrays 205 and 210 may stack multiple two-dimensional MRAM arrays to form a three dimensional MRAM array. MRAM arrays 205 and 210 show two two-dimensional MRAM arrays stacked. However, in other embodiments, the number of two-dimensional arrays that are stacked to form the three-dimensional MRAM array may be greater than two.

Referring specifically to FIG. 2B, MRAM array 205 includes a first two-dimensional MRAM array 240 and a second two-dimensional MRAM array 245 stacked in a z-direction 250 that is perpendicular to x-direction 220 and y-direction 225. Each of first two-dimensional MRAM array 240 and second two-dimensional MRAM array 245 may be configured as MRAM array 200 having a plurality of MRAM cells formed at an intersection of a word line and a bit line, as discussed above.

For example, as shown in FIG. 2B, first two-dimensional MRAM array 240 may include the plurality of MRAM cells 215A-215H, the plurality of word lines 230A-230D, and the plurality of bit lines 235A-235E arranged as described above with respect to MRAM array 200. Similarly, second two-dimensional MRAM array 245 may include the plurality of MRAM cells 215A-215H, the plurality of word lines 230A-230D, and the plurality of bit lines 235A-235E arranged as described above with respect to MRAM array 200. Further, first two-dimensional MRAM array 240 and second two-dimensional MRAM array 245 may be separated from one another by an insulating layer, which is not shown in FIG. 2B for clarity.

It is to be understood that the number of the plurality of MRAM cells 215A-215H in each of first two-dimensional MRAM array 240 and second two-dimensional MRAM array 245 may vary from that shown. Consequently, the number of the plurality of word lines 230A-230D and the plurality of bit lines 235A-235E in each of first two-dimensional MRAM array 240 and second two-dimensional MRAM array 245 may vary from that shown.

Further, although the number of the plurality of MRAM cells 215-215H (and therefore the number of the plurality of word lines 230A-230D and the plurality of bit lines 235A-235E) in each of first two-dimensional MRAM array 240 and second two-dimensional MRAM array 245 are shown as being equal, in other embodiments, the number of the plurality of MRAM cells (and therefore the number of the plurality of word lines and the number of the plurality of bit lines) may be unequal.

FIG. 2C shows another example of a three-dimensional MRAM array. MRAM array 210 may be configured as a mirrored configuration in which adjacent two-dimensional MRAM arrays share a set of bit lines or word lines. For example, MRAM array 210 is shown as sharing the plurality of bit lines 235A-235E. Thus, MRAM array 210 includes a first two-dimensional MRAM array 255 and a second two-dimensional MRAM array 260, both of which share the plurality of bit lines 235A-235E.

Each of first two-dimensional MRAM array 255 and second two-dimensional MRAM array 260 include their separate instances of the plurality of MRAM cells 215A-215H and their separate instances of the plurality of word lines 230A-230D. Although not shown, MRAM array 210 may be configured to share the plurality of word lines 230A-230D instead.

It is to be understood that the number of the plurality of MRAM cells 215A-215H in each of first two-dimensional MRAM array 2255 and second two-dimensional MRAM array 260 may vary from that shown. Consequently, the number of the plurality of word lines 230A-230D and the plurality of bit lines 235A-235E in each of first two-dimensional MRAM array 255 and second two-dimensional MRAM array 260 may vary from that shown.

Further, although the number of the plurality of MRAM cells 215-215H (and therefore the number of the plurality of word lines 230A-230D) in each of first two-dimensional MRAM array 255 and second two-dimensional MRAM array 260 are shown as being equal, in other embodiments, the number of the plurality of MRAM cells (and therefore the number of the plurality of word lines and the plurality of bit lines) may be unequal.

Turning now to FIG. 3, an example MRAM cell 300 is shown in greater detail, in accordance with some embodiments of the present disclosure. MRAM cell 300 may correspond to one of the plurality of MRAM cells 215A-215H of FIGS. 2A-2C above. MRAM cell 300 is formed at an intersection of and connected to a word line 305 and a bit line 310. Word line 305 corresponds to one of the plurality of word lines 230A-230D. Similarly, bit line 310 corresponds to one of the plurality of bit lines 235A-235E. For example, if MRAM cell 300 corresponds to MRAM cell 215A, word line 305 corresponds to word line 230A and bit line 310 corresponds to bit line 235A. For simplicity, only a portion of word line 305 and a portion of bit line 310 is shown in FIG. 3.

MRAM cell 300 may be formed by depositing a plurality of layers 315. Each of the plurality of layers 315 may be a continuous unpatterned layer, and may be deposited by anisotropically etching the plurality of layers into an array of pillar structures. Alternatively, the plurality of layers 315 of MRAM cell 300 may be formed by a damascene process by depositing the plurality of layers in an opening in an insulating layer. In other embodiments, other processes may be used for depositing and forming the plurality of layers 315 that make up MRAM cell 300.

The plurality of layers 315 of MRAM cell 300 may include a series connection of a magnetic tunnel junction formed by layers 320, 325, and 330. In some embodiments, the magnetic tunnel junction may be a magnetoelectric tunnel junction (MeTJ). In other embodiments, the magnetic tunnel junction may be of other types. Layer 330 of the magnetic tunnel junction forms a ferromagnetic free (unpinned) layer, layer 325 forms an insulating tunneling oxide layer, and layer 320 forms a ferromagnetic fixed reference (pinned) layer. Layer 320 is referred to herein as reference layer 320, layer 325 is referred to herein as insulating layer 325, and layer 330 is referred to herein as free layer 330.

The plurality of layers 315 of MRAM cell 300 also may include a two-terminal selector element 335. The plurality of layers 315 may further include one or more magnetic pinning layers for pinning reference layer 320. In some embodiments, the one or more pinning layers of the plurality of layers 315 may include a ferromagnetic pinning layer 340 and an optional diamagnetic or antiferromagnetic coupling layer 345 located between ferromagnetic pinning layer 340 and reference layer 320.

Although not shown, in some embodiments, ferromagnetic pinning layer 340 may itself include a stack of layers, such as a stack of six to ten alternating cobalt and platinum layers having a thickness on 0.3 to 0.4 nm each. In some embodiments, the optional coupling layer 345 may be a 0.2 to 0.3 nm thick tantalum layer. In some embodiments, any other suitable layer materials and thicknesses instead of and/or in addition to the ones described above may be used to pin reference layer 320.

Reference layer 320 has a fixed magnetization direction. The direction of magnetization of reference layer 320 may be fixed, for example, by a combination of pinning layer 340 and coupling layer 345. For example, pinning layer 340 may include a permanent magnet having a magnetization direction that is parallel to the height direction of MRAM cell 300, and thus, perpendicular to the interface between free layer 330 and insulating layer 325.

In some embodiments, the magnetization of free layer 330 may be antiparallel to the magnetization of reference layer 320. The thickness of coupling layer 345 may be selected such that the magnetization of reference layer 320 is antiparallel to the magnetization of pinning layer 340. Thus, the magnetization of reference layer 320 may be perpendicular to the interface between free layer 330 and insulating layer 325. For example, reference layer 320 may include CoFeB layer having a thickness in a range from 1 nm to 2 nm. In some embodiments, the magnetic moment of reference layer 320 may be chosen such that essentially no net perpendicular magnetic field is present at free layer 330.

Insulating layer 325 allows passage of leakage current therethrough, for example, for measurement of resistance of the magnetic tunnel junction, and thus, determination of the alignment of the magnetization of free layer 330 with respect to reference layer 320. Magnetic anisotropy in free layer 330 provides an easy axis of magnetization, which enables two stable states for the free layer.

When the magnetization of free layer 330 is parallel to the magnetization of reference layer 320, a low resistance state having a low resistance $R_P$ results. When the magnetization of free layer 330 is antiparallel to the magnetization of reference layer 320, a high resistance state having a high resistance $R_{AP}$ results.

The tunneling magnetoresistance ratio, which is defined as $(R_{AP}/R_P)-1$, is a measure of performance metric for the magnetic tunnel junction, and affects the sensing margin and error rates directly. In some embodiments, the thickness of insulating layer 325 may be selected such that spin torque transfer (STT) effect is insignificant relative to the precession of magnetization of free layer 330 about an in-plane (within the plane of the interface between the free layer 330 and insulating layer 325) axis under an applied electrical bias voltage. For example, insulating layer 325 may include an MgO layer. The MgO layer preferably has a thickness greater than 1.2 nm to reduce the switching energy, such as a thickness in a range from 1.3 nm to 3 nm, such as from 1.4 nm to 1.7 nm.

Free layer 330 has perpendicular magnetic anisotropy. Thus, the easy axis of magnetization may be perpendicular to the interface between free layer 330 and insulating layer 325. In embodiments in which the interface between free layer 330 and insulating layer 325 is horizontal, the magnetization of the free layer may be along an "up" direction, or along a "down" direction, i.e., one of the two vertical directions.

The magnetic tunnel junction may be formed with built-in asymmetry along the vertical direction. In this case, the Perpendicular Magnetic Anisotropy (PMA) may include a constant term that is independent of applied voltage across free layer 330 and reference layer 320, and an odd term of significant magnitude (with respect to the constant term) that is proportional to the applied voltage across free layer 330 and reference layer 320.

In other words, the perpendicular magnetic anisotropy may be significantly increased or decreased by applying an external bias voltage of a suitable polarity across free layer 330 and reference layer 320. In some embodiments, free layer 330 may include a CoFeB layer. Free layer 330 may have a thickness of less than 1.4 nm, such as a thickness in a range from 0.9 nm to 1.3 nm to permit the electric field to penetrate it during operation, although lesser and greater thicknesses can also be employed.

MRAM cell 300 is shown in a vertical configuration, and in some embodiments, MRAM cell 300 may be configured in a horizontal configuration instead. In a horizontal configuration, free layer 330 may be located below reference layer 320 rather than above reference layer 320, and pinning layer 340 may be located above reference layer 320. Furthermore, in the horizontal configuration, selector element 335 may be located such that the remaining layers are formed over selector element 335.

MRAM cell 300 may be written or read using a voltage controlled magnetic anisotropy (VCMA) effect. In other words, a voltage may be applied between a selected word line and a selected bit line, and due to the VCMA effect, MRAM cell 300 may be toggled back and forth between the parallel and anti-parallel states by pulsing a voltage in one direction (e.g., in forward bias mode), such as by applying a negative voltage polarity to free layer 330 and a positive voltage polarity to reference layer 320.

In some embodiments, a very small current may flow between free layer 330 and reference layer 320 during the writing operation. However, the current may be small that STT effects may be ignored, and ohmic dissipation may be minimal, which reduces write energy. In contrast, a larger current may flow between free layer 330 and reference layer 320 through insulating layer 325 during the reading operation.

Figure 4:
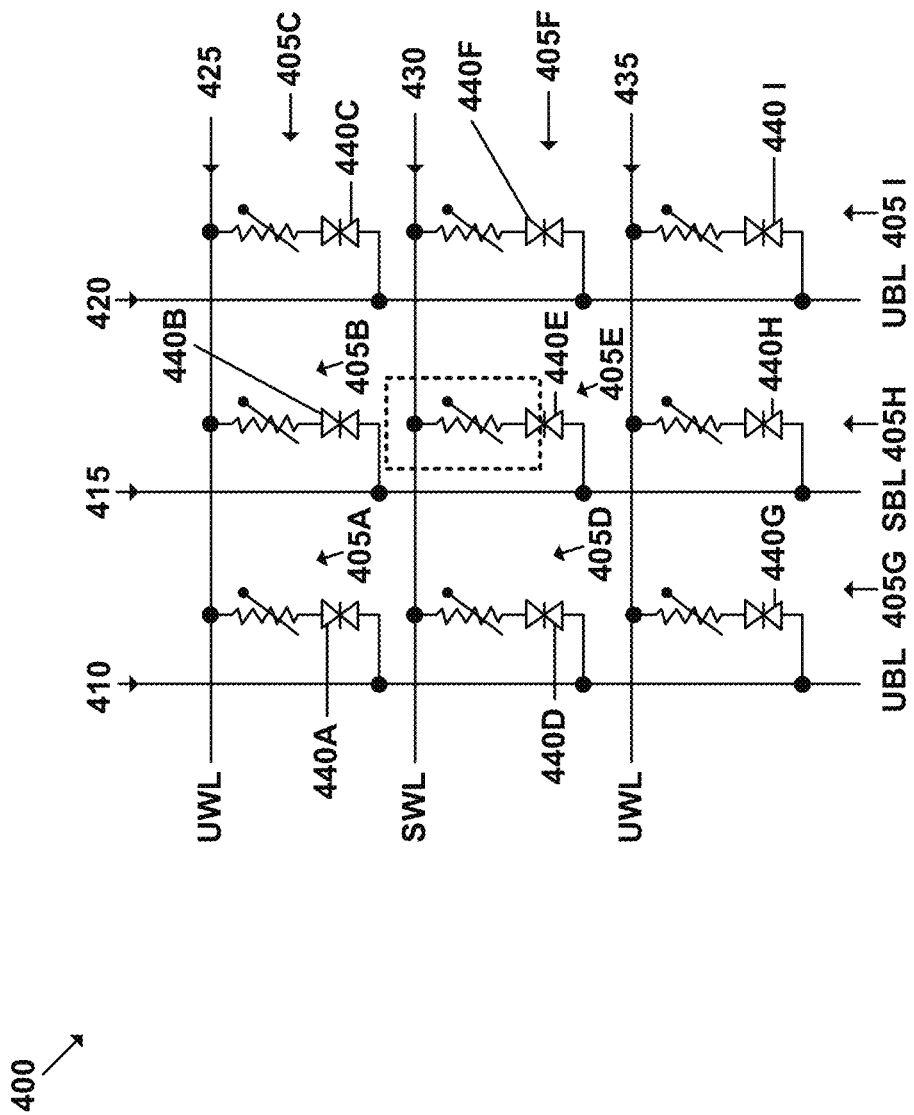
FIG. 4 is an example circuit diagram showing read and write operations in the MRAM array of FIGS. 2A-3, in accordance with some embodiments of the present disclosure.

Referring now to FIG. 4, an example reading and writing operation in an MRAM cell of an MRAM array 400 is shown, in accordance with some embodiments of the present disclosure. MRAM array 400 includes a plurality of MRAM cells 405A-405I. Although nine MRAM cells are shown in MRAM array 400, the number of MRAM cells in MRAM array 400 may vary.

Each of the plurality of MRAM cells 405A-405I may be connected to a bit line and a word line. For example, MRAM cells 405A, 405D, and 405G may be considered to be in the same "column" and share and are connected to a bit line 410. MRAM cells 405B, 405E, and 405H share and are connected to a bit line 415. Similarly, MRAM cells 405C, 405F, and 405I share and are connected to a bit line 420.

MRAM cells 405A, 405B, and 405C may be considered to be in the same "row," and are connected to a word line 425. Similarly, MRAM cells 405D, 405E, and 405F are connected to a word line 430, while MRAM cells 405G, 405H, and 405I are connected to a word line 435. Thus, each of the plurality of MRAM cells 405A-405I is formed at an intersection of a bit line and a word line.

The MRAM cell that is to be programmed or read from may be selected by enabling the associated bit line and word line. For example, to program or read from MRAM cell 405E, bit line 415 and word line 430 to which MRAM cell 405E is connected may be enabled. Thus, bit line 415 and word line 430 may be considered a "selected bit line" (SBL) and "selected word line" (SWL), respectively. The other bit lines (e.g., bit lines 410 and 420) may be considered the "unselected bit line" (UBL) and the other word lines (e.g., word lines 425 and 435) may be considered the "unselected word line" (UWL).

To write or program MRAM cell 405E, in some embodiments, a forward bias may be applied to facilitate switching of the magnetization state of the free layer of the magnetic tunnel junction of MRAM cell 405E. Similarly, to read from MRAM cell 405E, in some embodiments, a reverse bias may be applied to sense the magnetization state of the free layer of the magnetic tunnel junction of that MRAM cell.

During the reading and writing operations, a two-terminal selector element of the unselected magnetic tunnel junctions prevent writing and/or disturbing of the unselected MRAM cells. For example, when MRAM cell 405E is the selected MRAM cell, MRAM cells 405A-405D and 405F-4015I are the unselected MRAM cells, and an associated selector element 440A-44D and 440E-440I, respectively, of those MRAM cells may prevent reading/writing to those MRAM cells.

In some embodiments, a write pulse with a first inhibit voltage may be applied to each of UWL (e.g., UWL 425 and 435) and a write pulse with a second inhibit voltage may be applied to each of UBL (e.g., UBL 410 and 420) during reading and writing to a selected MRAM cell (e.g., MRAM cell 405E). In some embodiments, during programming, the first inhibit voltage may be in a range from 0.4 V to 1.2 V, such as 0.6 V, and the second inhibit voltage may be in a range from 0.4 V to 1.2 V, such as 0.6 V. The second inhibit voltage may be the same as, higher than, or lower than the first inhibit voltage.

SWL 430 and SBL 415, on the other hand, may be biased to provide a write pulse voltage to program the associated MRAM cell 405E. The write pulse may be greater than the turn-on voltage of associated selector element 440E. For example, SBL 415 may be biased at 0 V, and SWL 430 may be biased with a positive voltage pulse of a magnitude in a range from 1.0 V to 2.5 V, such as 1.2 V for both a reset operation (e.g., parallel to anti-parallel magnetic state) and a set operation (e.g., anti-parallel to parallel magnetic state). The pulse width duration of the write pulse may be on the order of a nanosecond.

During reading, the first inhibit voltage may be in a range from 0.3 V to 1.0 V, such as 0.45 V to 5 V, and the second inhibit voltage may be in a range from 0.3 V to 1.0 V, such as 0.45 V to 5 V. The second inhibit voltage may be the same as, higher than, or lower than the first inhibit voltage. The first and second inhibit voltages during sensing may be the same as, or different from, the first and second inhibit voltages during programming, respectively.

If all inhibit voltages are the same, then time switching from read to write may be saved since a read-before-write may be used for every write (to determine whether or not to send the write pulse). SWL 430 and SBL 415 may be biased to provide the optimal reading voltage, which does not have a time limit as in the case of the write pulses. For example, SBL 415 may be biased at a voltage in a range from 0.7 V to 2.0 V, such as 0.9 V to 1 V, and SWL 430 may be biased with 0 V.

Figure 5:
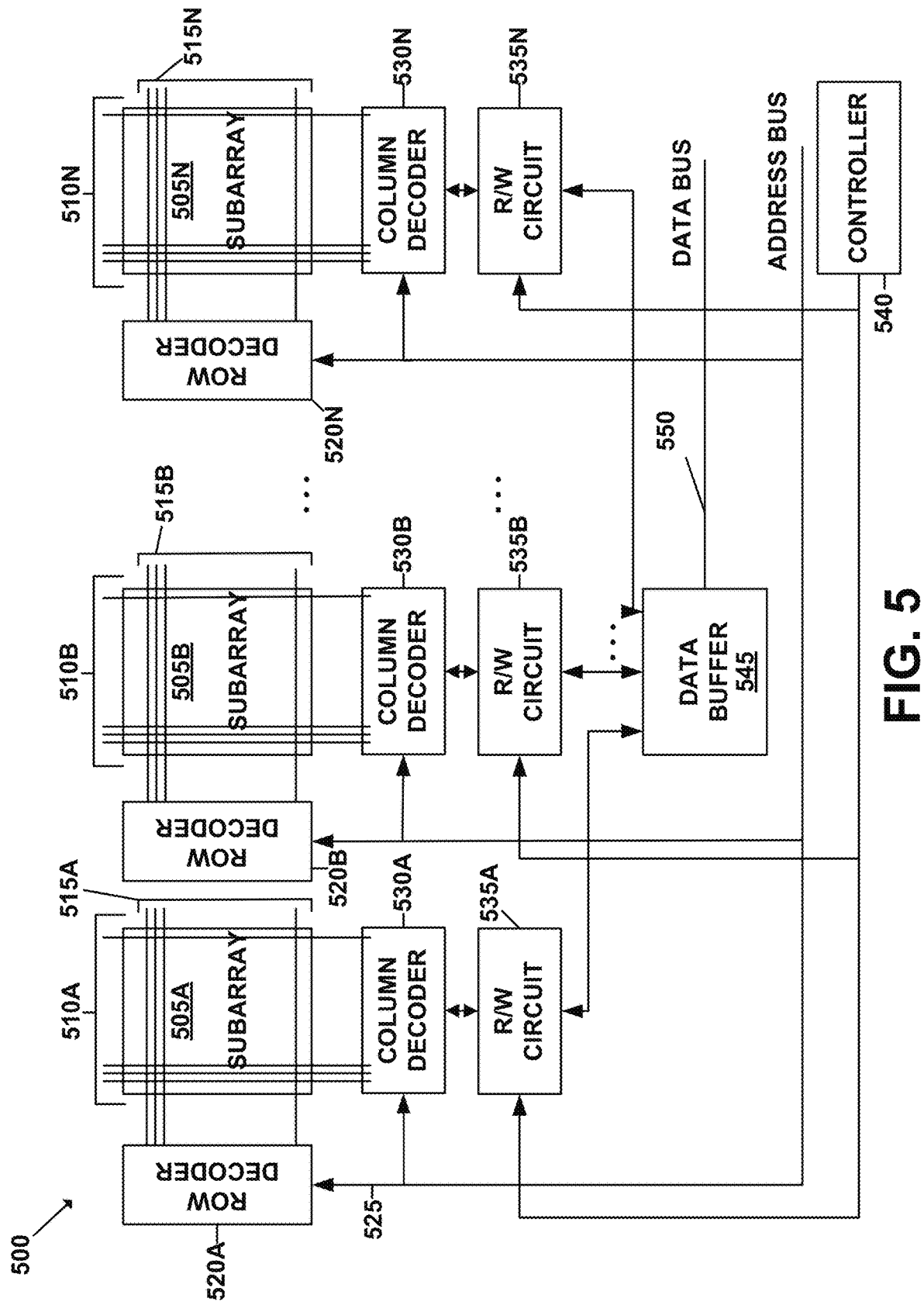
FIG. 5 is an example block diagram showing additional details of the MRAM arrays of FIGS. 2A-2C, in accordance with some embodiments of the present disclosure.

Turning now to FIG. 5, an MRAM array 500 is shown, in accordance with some embodiments of the present disclosure. MRAM array 500 is analogous to MRAM arrays 145, 205, 210, and 215. MRAM array 500 includes a plurality of MRAM sub-arrays 505A-505N. Each of the plurality of MRAM sub-arrays 505A-505N may include a plurality of MRAM cells. Further, each of the plurality of MRAM sub-arrays 505A-505N include a plurality of bit lines 510A-510N, respectively, that extend along a column direction, as discussed above. Each of the plurality of MRAM sub-arrays 505A-505N also include a plurality of word lines 515A-515N, respectively, that extend along a row direction. Further, each of the plurality of MRAM sub-arrays 505A-505N may be configured for independent operation and control.

Thus, each of the plurality of MRAM sub-arrays 505A-505N may be associated with a row decoder 520A-520N, respectively, to select an associated one of the plurality of word lines 515A-515N based upon address information provided via an address bus 525. Each of the plurality of MRAM sub-arrays 505A-505N also may be associated with a column decoder 530A-530N, respectively, to select an associated one of the plurality of bit lines 510A-510N. By selecting and unselecting word lines and bit lines of the plurality of MRAM sub-arrays 505A-505N, MRAM cells of those MRAM sub-arrays may be enabled for writing data into or reading data from those MRAM cells.

Each of the plurality of MRAM sub-arrays 505A-505N also may be associated with a read-write circuit 535A-535N, respectively. In some embodiments, each of the read-write circuits 535A-535N may include one or more sense amplifiers to enable reading and writing data to the associated one of the plurality of MRAM sub-arrays 505A-505N under control of a controller 540. Controller 540 may be analogous to memory controller 135 of FIG. 1. In some embodiments, controller 540 may be separate from the memory controller.

Further, each of read-write circuits 535A-535N may be connected with a data buffer 545. In some embodiments, a separate instance of data buffer 545 may be used for each of the plurality of MRAM sub-arrays 505A-505N. Data buffer 545 may be used to store data received via a data bus 550 that is to be written in the plurality of MRAM sub-arrays 505A-505N. Data buffer 545 also may be used to store the data read from the plurality of MRAM sub-arrays 505A-505N before transmitting that data on data bus 550.

Thus, each of the plurality of MRAM sub-arrays 505A-505N is configured for parallel operation. In other words, controller 540 associated with MRAM array 500 may be able to control each of the plurality of MRAM sub-arrays 505A-505N independently and simultaneously. Additionally, each of the plurality of MRAM sub-arrays 505A-505N may be of the same size (e.g., same capacity) or of a different size relative to other sub-arrays. Each of the plurality of MRAM sub-arrays 505A-505N may be configured to store data that is stored within MRAM array 500.

For each piece of data that is stored within MRAM array 500, each of the plurality of MRAM sub-arrays 505A-505N is configured to store one bit of the piece of data. For example, for eight-bit data that are stored within MRAM array 500, an MRAM cell of a first sub-array of the plurality of MRAM sub-arrays 505A-505N may be configured to store a first bit of the eight-bit data, an MRAM cell of a second sub-array may be configured to store a second bit of the eight-bit data, an MRAM cell of a third sub-array may be configured to store a third bit of the eight-bit data, and so on. Further, each of the plurality of MRAM sub-arrays 505A-505N may be configured to store a plurality of data, with each MRAM sub-array storing one bit of each of the plurality of data.

The number of sub-arrays that form part of the plurality of MRAM sub-arrays 505A-505N may vary based upon the configuration of MRAM array 500 and the bandwidth (e.g., bit-width) of each piece of data that the MRAM module stores. In some embodiments, the plurality of MRAM sub-arrays 505A-505N may include eight sub-arrays to store eight-bit data. In other embodiments, the plurality of MRAM sub-arrays 505A-505N may include sixteen sub-arrays to store sixteen-bit data. In yet other embodiments, groups of sub-arrays may be formed to store data that is larger than eight-bits in width.

For example, in some embodiments, a first group of eight sub-arrays may store the bits zero-seven of the data, while a second group of eight sub-arrays may store bits eight-fifteen of the sixteen bit data. Thus, depending upon the size of the data that is to be stored and the configuration of MRAM array 500, the number of sub-arrays in the plurality of MRAM sub-arrays 505A-505N may be vary.

Further, each of the plurality of MRAM sub-arrays 505A-505N may be dedicated to storing a particular bit position of the data. Specifically, each piece of data, regardless of the bit-width, includes a Least Significant Bit (LSB), a Most Significant Bit (MSB), and bits occupying bit positions between the LSB and the MSB. As used herein, the LSB is the lowest bit of a piece of data and the MSB is the highest bit of the piece of data.

Thus, for example, for an eight bit data, B0B1B2B3B4B5B6B7, B7 is the MSB and B0 is the LSB. Bits B1-B6 occupy bit positions between the MSB and LSB.

In some embodiments, the MSB bit, B7, may be said to occupy the first bit position, bit B6 may be said to occupy the second bit position, bit B5 may be said to occupy the third bit position, and so on. The LSB bit, B0, may be said to occupy the eighth bit position. Each of the plurality of MRAM sub-arrays 505A-505N may be dedicated to storing a specific bit position of a piece of data.

Figure 6:
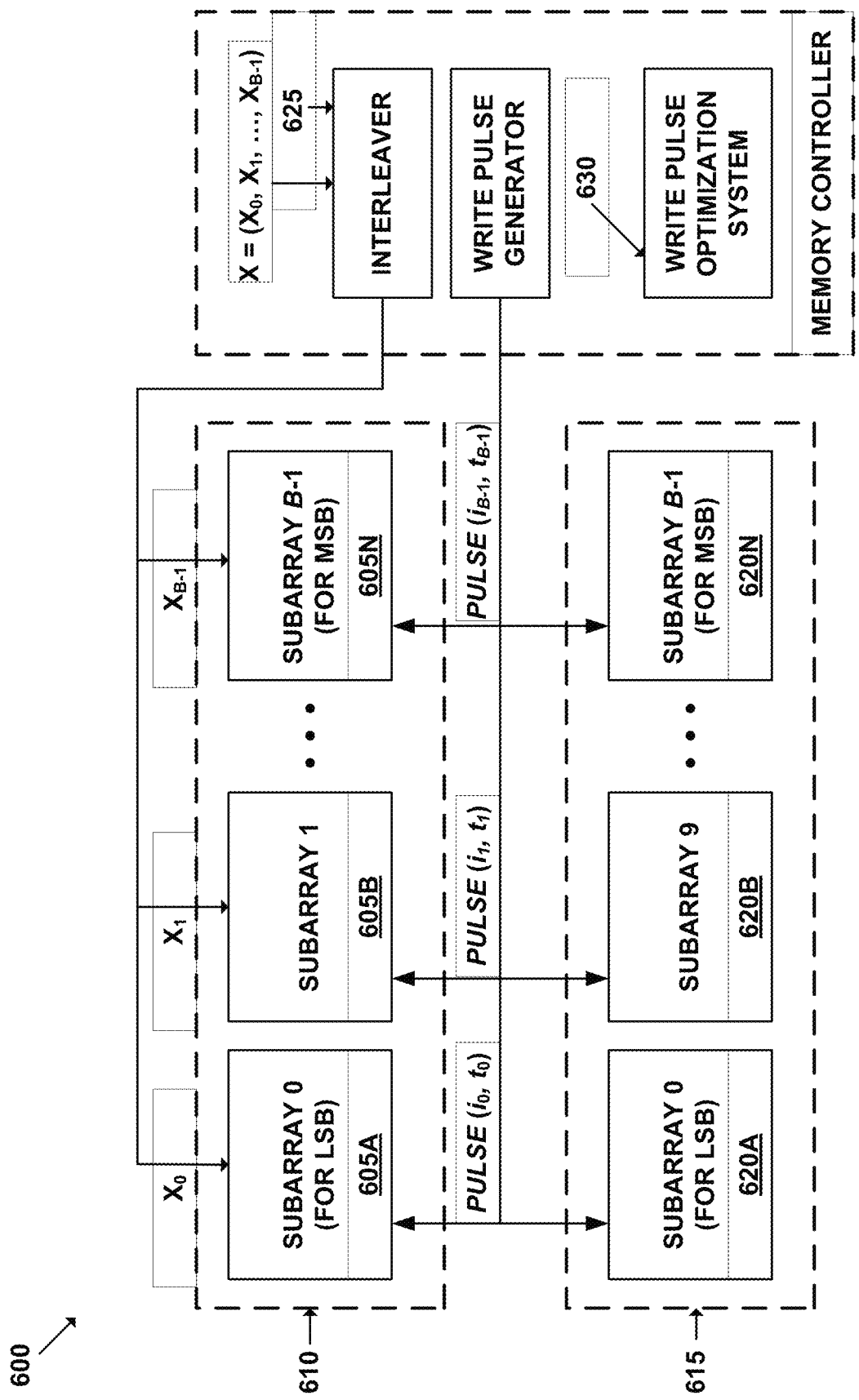
FIG. 6 is an example block diagram showing further details of the MRAM array of FIG. 5, in accordance with some embodiments of the present disclosure.

Referring to FIG. 6, an example MRAM array 600 is shown, in accordance with some embodiments of the present disclosure. MRAM array 600 is similar to the MRAM array 500, but only some elements are shown in FIG. 6. Similar to MRAM array 500, MRAM array 600 includes a plurality of MRAM sub-arrays 605A-605N. In some embodiments, to store a B-bit word, the plurality of MRAM sub-arrays 605A-605N includes B MRAM sub-arrays, with each MRAM sub-array storing one bit of the B-bit word. As indicated above, each of the plurality of MRAM sub-arrays 605A-605N may be dedicated to storing a specific bit position of the B-bit word.

For example and as shown in FIG. 6, MRAM sub-array 605A may be configured to store the LSB (e.g., bit B0 in the example above), MRAM sub-array 605N may be configured to store the MSB (e.g., bit B7 in the example above), while MRAM sub-arrays 605B-605M may be configured to store bit positions between the LSB and MSB (e.g., bits B1-B6 in the example above).

By virtue of being dedicated to storing a specific bit position of data, each time a piece of data is to be stored, the LSB of that data may be stored within MRAM sub-array 605A, the MSB of the data may be stored within MRAM sub-array 605N, and each bit between the LSB and MSB may be stored within one MRAM sub-array between MRAM sub-array 605A and 605N depending upon the bit position of that bit and the MRAM sub-array that is configured to store that bit position.

As also indicated above, in some embodiments, to store the B-bit word, the plurality of MRAM sub-arrays 605A-605N may include B MRAM sub-arrays. In other embodiments, multiple groups of MRAM sub-arrays may be created, with each group storing a subset of the B-bit word. For example, to store a sixteen bit word, a first group 610 of the plurality of MRAM sub-arrays 605A-605N may be created to store bit positions one to eight of the sixteen bit word and a second group 615 may be created to store the bit positions nine to sixteen of the sixteen bit word.

Thus, each of first group 610 and second group 615 may include eight MRAM sub-arrays to store one bit of the sixteen bit word. Therefore, the plurality of MRAM sub-arrays 605A-605N in first group 610 may include eight MRAM sub-arrays. Similarly, second group 615 may include MRAM sub-arrays 620A-620N, and particularly, eight MRAM sub-arrays. For word sizes greater than sixteen bits, additional groups of MRAM sub-arrays may be formed. Alternatively, the number of MRAM sub-arrays in first group 610 and second group 615 may be increased.

Further, for a sixteen bit word where the bit positions one to eight are stored in the plurality of MRAM sub-arrays 605A-605N and the bit positions nine to sixteen are stored in the plurality of MRAM sub-arrays 620A-620N, the MSB in the bit positions one to eight may be the bit corresponding to bit position one and may be stored within the MRAM sub-array dedicated to storing the MSB (e.g., MRAM sub-array 605N) and the bit position eight is the LSB and may be stored in the MRAM sub-array dedicated to storing the LSB (e.g., MRAM sub-array 605A).

Similarly, for the bit positions nine to sixteen, the bit position nine is the MSB and may be stored within the MRAM sub-array dedicated to storing the MSB (e.g., MRAM sub-array 620N) and the bit position sixteen is the LSB and may be stored in the MRAM sub-array dedicated to storing the LSB (e.g., MRAM sub-array 620A). Thus, the LSB and MSB in the subset of the data bits that is being stored in each group may be identified and stored in the MRAM sub-array dedicated to that bit position. For simplicity, the discussion below is with respect to the plurality of MRAM sub-arrays 605A-605N. However, the same discussion also applies to the plurality of MRAM sub-arrays 620A-620N.

An interleaver 625 of MRAM array 600 may be configured to know which MRAM sub-array of the plurality of sub-arrays 605A-605N stores data of which bit position. Thus, interleaver 625 may be configured to know that the LSB of data is to be stored within MRAM sub-array 605A, the MSB of the data is to be stored within MRAM sub-array 605N, and so on.

For example, for an eight-bit data, x=(x0, x1, x2, ... x7), where bit x0 is the LSB and bit x7 is the MSB, interleaver 625 may store bit x0 in MRAM sub-array 605A, bit x1 in MRAM sub-array 605B, bit x7 in MRAM sub-array 605N, and so on. As will be discussed further below, interleaver 625 may be configured to periodically scramble or change which MRAM sub-array stores which bit positions to reduce wear on MRAM sub-arrays 605A-605N.

Further, interleaver 625 also may be used for storing data bits in the plurality of MRAM sub-arrays 620A-620N. In some embodiments, a separate interleaver may be used for the plurality of MRAM sub-arrays 620A-620N. Thus, each MRAM sub-array may be configured to store a data bit corresponding to a particular bit position.

By storing each bit of data in a different MRAM sub-array, a write pulse optimization system 630 may determine optimized parameters (e.g., write current and pulse width) of a write pulse for one or more of the plurality of MRAM sub-arrays 605A-605N depending upon the bit position of data that is stored in a particular MRAM sub-array.

In many applications such as machine-learning applications and signal processing, the impact of bits errors depends upon the bit position. For example, errors in the MSB position of an image pixel may degrade overall image quality more than errors in the LSB position. An error in the MSB also may impact the inference or characterization accuracy in machine learning applications. Thus, errors in the LSB may be more tolerable than errors in the MSB.

In other words, maintaining the accuracy of the MSB may be more important than maintaining the accuracy of the LSB. To maintain the greater accuracy of the MSB compared to the LSB, as discussed herein, the write pulse used for writing data bits in the MSB position may vary from the write pulse used for writing data bits in the LSB position. In other embodiments, errors in other bit positions other than MSB and LSB positions may degrade the data more.

By separating and storing each bit of a piece of data in a separate MRAM sub-array, MRAM array 600 provides the ability to determine different write pulses for one or more of the plurality of MRAM sub-arrays 605A-605N based upon the relative importance of the bit position of the data bit stored in those sub-arrays. Write pulse optimization system 630 may be configured to determine the write pulse for one or more bit positions depending upon the relative importance of those bit positions.

As discussed above, the write pulse is a function of write current and pulse width. By increasing the magnitude of the write current and/or the length/duration of the pulse width, the WER may be reduced. However, increasing the magnitude of the write current and/or the length/duration of the pulse width increases the write energy or power needed to write a data bit. Thus, the write energy, E, is also a function of write current and pulse width of the write pulse:

$$E \propto i^2 t \tag{I}$$

As seen from Equation (I) above, write pulse E is directly proportional to write current i and the length/duration of the pulse width t. Further, the error in writing each bit of a piece of data may be defined in terms of a Bit Error Rate (BER) (also referred to herein as Write Error Rate (WER) or Write Failure Rate (WFR)). Specifically, the BER may be defined as the number of write errors in a particular bit per unit time. Lower BER is generally desirable.

The BER is referred to herein as a fidelity metric. The BER decreases exponentially as the write current of the write pulse increases. Similarly, the BER decreases exponentially as the length/duration of the pulse width of the write pulse increases. The BER $p_f$ may be expressed as:

$$p_f = \frac{\pi^2 \Delta}{8} \exp\left(-2(i-1) \cdot \frac{t}{t_0}\right) = \frac{\pi^2 \Delta}{8} \exp\left(-2j \cdot \frac{t}{t_0}\right) \tag{II}$$

Where:

j=(i−1)=over drive current i=normalized current=I/$I_{co}$ $I_{co}$=critical current and I=write current t=pulse width of the write pulse $t_0$=fixed parameter based on the characteristic relaxation time of magnetic moment.

Additional details of how Equation (II) is derived may be found in Khvalkovskiy et al., "Basic Principles of STT-MRAM Cell Operation in Memory Arrays," Journal of Physics D Applied Physics, (46:7) February 2013, the entirety of which is incorporated by reference herein.

Equation (II) may be solved using a convex optimization algorithm to minimize BER subject to a constraint of a resource metric. In some embodiments, the resource metric may be write energy. For example, for a desired write energy, Equation (II) may be solved to obtain a magnitude of an optimized write current and/or the length/duration of an optimized pulse width that reduces or minimizes BER.

In some embodiments, an Alternate Convex Search (ACS) algorithm may be used to solve Equation (II). In some embodiments, the ACS algorithm may alternate solving the following two optimizations until satisfying a stopping criteria:

(1) Fix i, then solve:

$$t^* = \underset{t}{\mathrm{argmin}}\, BER(i, t)$$

$$= \frac{\pi^2 \Delta}{8} \exp\left(-2(i-1) \cdot \frac{t}{t_0}\right)$$

subject to $E(i, t) \leq \varepsilon$, $0 \leq t \leq \delta$ (2) Fix t=t*, then solve:

$$i^* = \underset{i}{\operatorname{argmin}} BER(i, t^*)$$

$$= \frac{\pi^2 \Delta}{8} \exp\left(-2(i-1) \cdot \frac{t}{t_0}\right)$$

subject to $E(i, t^*) \leq \varepsilon, 1 < i$

The equations above are discussed in greater detail below. In other embodiments, other convex algorithms and possibly non-convex algorithms may be used for solving Equation (II). Thus, Equation (II) may be solved using a variety of convex and non-convex algorithms to minimize the fidelity metric (e.g., BER) subject to (e.g., to satisfy) a desired resource metric (e.g., write energy).

Further, in some embodiments, Equation (II) may be solved using the ACS algorithm (or another algorithm) by fixing the magnitude of the write current and determining the length/duration of an optimal pulse width t* as follows:

$$t^* = \underset{t}{\operatorname{argmin}} BER(i, t) \quad \text{(III)}$$

$$= \frac{\pi^2 \Delta}{8} \exp\left(-2(i-1) \cdot \frac{t}{t_0}\right)$$

subject to $E(i, t) \leq \varepsilon, 0 \leq t \leq \delta$

Where
E(i, t)=write energy that is a function of write current and length/duration of the pulse width.
ε=maximum allowable write energy (e.g., resource metric constraint).
t=length/duration of non-optimized pulse width.
δ=maximum allowable length/duration of pulse width (such that the optimized pulse width cannot exceed the maximum allowable pulse width length/duration).
Δ is the ratio of the energy barrier, additional details of which may be found in Khvalkovskiy et al., mentioned above.

Thus, by solving Equation (III), an optimal pulse width t* may be obtained for a particular data bit that reduces or minimizes BER while satisfying the write energy constraint. Upon determining the optimal pulse width t* for a particular bit, the pulse width tin the equation below may be fixed as the optimal pulse width t* determined using Equation (III), and then Equation (II) may be solved to determine an optimal write current value i* as follows:

$$i^* = \underset{i}{\operatorname{argmin}} BER(i, t^*) \quad \text{(IV)}$$

$$= \frac{\pi^2 \Delta}{8} \exp\left(-2(i-1) \cdot \frac{t}{t_0}\right)$$

subject to $E(i, t^*) \leq \varepsilon, 1 < i$

Where t=t* obtained from solving Equation (III).

Thus, by solving Equation (III), an optimal write current i* may be obtained for a particular data bit that reduces or minimizes BER while satisfying the write energy constraint. Once the optimal write current value i* is determined, the write current value i in Equation (III) may be fixed as the optimal write current value i* and Equations (III) and (IV) may be solved again, as discussed above. The cycle of determining the optimal pulse width while fixing the write current to an optimal write current value from a previous cycle, and then determining the optimal current value while fixing the pulse width as the optimal pulse width from the same cycle is repeated until a stopping criterion is satisfied.

In some embodiments, the stopping criteria may be based upon a number of cycles (e.g., ten cycles) of solving Equations (III) and (IV). In other embodiments, the stopping criteria may be the convergence of pulse width and write current values. In other embodiments, other stopping criteria may be used.

When the stopping criteria is reached, the optimal pulse width t* determined from solving Equation (III) may be used as the optimal pulse width of the write pulse and the optimal write current i* determined from Equation (IV) may be used as the optimal write current of the write pulse. Upon applying a write pulse with the optimal write current i* and the optimal pulse width t* from equations (III) and (IV), respectively, the BER of a particular MRAM cell may be minimized and the write energy may be less than a maximum allowable write energy, ε.

In some embodiments, instead of optimizing both the write current and the pulse width, either the write current or the pulse width may be optimized. For example, in some embodiments, an optimal write current i* may be determined using Equation (IV). Specifically, to determine the optimal write current, the pulse width tin Equation (IV) may be fixed to a pre-determined pulse width value and the resource metric (e.g., the write energy) may be defined. Then, by solving Equation (IV), the optimal write current value may be obtained. Thus, the write current is optimized but the pulse width is not optimized in this case.

In other embodiments, an optimal pulse width t* may be determined using Equation (III). Specifically, to determine the optimal pulse width, the write current i in Equation (III) may be fixed to a pre-determined write current value and the resource metric (e.g., the write energy) may be defined. Then, by solving Equation (III), the optimal pulse width value may be obtained. Thus, the pulse width is optimized but the write current is not optimized. In some embodiments, the optimal parameters may be i=2 and t=ε4, obtained by optimizing the equations as discussed above.

Thus, by optimizing the write current and/or the pulse width of the write pulse, the BER of a particular MRAM cell may be minimized while satisfying a desired resource metric (e.g., the write energy). BER is one example of a fidelity metric. In other embodiments, other fidelity metrics may be used.

For example, a Mean Square Error (MSE) is another fidelity metric. Although BER defines the error rate for each bit of a data, the MSE defines the cumulative error rate for all bits of the data combined. Peak Signal to Noise Ratio (PSNR) is another fidelity metric that may be used instead of BER and MSE. PSNR represents a measure of the peak error in a piece of data. Other fidelity metrics may be used as desired. Similarly, write energy is one resource metric. In other embodiments, other types of resource metrics may be used, such as write speed, etc.

If the fidelity metric for the B-bit word is MSE (where the fidelity metric for each bit of the B-bit word is BER), the MSE for the B-bit word may be defined as:

$$\text{MSE}(t) = \Sigma_{b=0}^{B-1} 4^b p(i_b, t_b) \quad \text{(V)}$$

In Equation (V) above, b represents the bit position, $t_b$ represents the pulse width for a write pulse for writing a bit having a particular bit position, b, and $i_b$ represents the write current for the write pulse for writing a bit having a particular bit position, b. Further, $p(i_b, t_b)$ represents the BER of each bit position and may be minimized by solving Equation (II) above. Thus, the MSE of the B-bit word is the total sum of the BER of each bit of the B bit word.

In Equation (V), $4^b$ represents the differential importance of each position. In other words, the value of $4^b$ changes based upon the bit position. For example, for b=0, $4^b$=1, whereas for b=7, $4^b$=16384. Additional details of Equation (V) above may be found in Kim et al., Generalized Water-Filling for Source-Aware Energy-Efficient SRAMS, IEEE Transactions on Communications, (66:10) October 2018, the entirety of which is incorporated by reference herein.

Thus, based upon the value of $4^b$, the MSE of the B-bit word varies. The above equations may be summarized as follows:

|  | Single bit | B-bit word |
|---|---|---|
| Variable | i, t (scalar) | $i = (i_0, i_1, \ldots, i_{B-1})$, $t = (t_0, t_1, \ldots, t_{B-1})$ (vector, where $t_0$, $i_0$ are LSB and $t_{B-1}$, $i_{B-1}$ are MSB) |
| Write Energy (Resource Metric) | $i^2 t$ | $\sum_{b=0}^{B-1} i_b^2 t_b$ |
| Fidelity Metric | BER(t) = p(i, t) | $MSE(t) = \sum_{b=0}^{B-1} 4^b p(i_b, t_b)$ |

A convex optimization problem may be formulated to solve the above equations and determine the optimal pulse width and/or the optimal write current for each bit position of the B-bit word. In some embodiments, for a given write energy constraint, an optimal write current value and/or an optimal pulse width may be computed for each bit position of the B-bit word that minimizes the MSE.

Specifically, in some embodiments, the write current and the pulse width may be alternately updated as discussed above with respect to BER in multiple cycles. For example, in some embodiments, in the first cycle the write current may be fixed and an optimal pulse width t* may be computed as follows:

$$t^* = \underset{t}{\operatorname{argmin}} MSE(i, t) \text{ subject to } E(i, t) \leq \varepsilon, 0 \leq t_b \leq \delta \quad \text{(VI)}$$

Where $MSE(i,t) = \Sigma_{b=0}^{B-1} 4^b p(i_b, t_b)$.

$p(i_b, t_b)$=BER of bit position, b, and computed using Equation II, as discussed above.

ε=maximum allowable write energy (resource metric constraint).

E=maximum allowable duration of pulse width or upper bound of pulse width.

Equation (VI) may be solved using the ACS algorithm or any other algorithm that is considered suitable. Upon computing the optimal pulse width, t* using Equation (VI), the pulse width t may be fixed as t*, and an optimal write current i* may be computed as follows:
Fix t=t*, then solve:

$$i^* = \underset{i}{\operatorname{argmin}} MSE(i, t^*) \text{ subject to } E(i, t^*) \leq \varepsilon, 1 + \epsilon \leq i_b \quad \text{(VII)}$$

Where $MSE(i,t) = \Sigma_{b=0}^{B-1} 4^b p(i_b, t_b)$.

$p(i_b, t_b)$=BER of bit position, b and computed using Equation II, as discussed above.

ε=maximum allowable write energy (resource metric constraint)

$$i_b = \frac{I}{I_{C0}} (I \geq I_{c0}) \text{ and } p_f(i = 1) \to \infty.$$

The optimal write current value i* obtained from Equation (VII) may then be fixed as the write current i value in Equation (VI) in cycle 2, and Equation (VI) may be solved again. The value of the optimal pulse width obtained by solving Equation (VI) in cycle 2 may then be fixed as the pulse width value in Equation VII, and Equation (VII) may be solved to obtain the optimal write current value.

The cycles of solving Equations (VI) and (VII) may be repeated until a stopping criteria, as discussed above, is reached. The values of the optimal write current and the optimal pulse width from the final cycle minimize MSE while satisfying the write energy constraint. These final values may then be used to generate write pulses for each MRAM sub-array of the plurality of MRAM sub-arrays 605A-605N.

Specifically, by solving Equations (VI) and (VII) as discussed above, B values of optimal write current and B values of optimal pulse width for a B-bit word may be generated, and the values vary based upon the bit position of a bit. For example, for an 8-bit word, by solving Equations (VI) and VII, eight values of the optimal write current and eight values of the optimal pulse width may be generated, with each value of the optimal write current and optimal pulse width being used to generate an optimal write pulse for one MRAM sub-array depending upon the bit position of the bit stored in that MRAM sub-array.

In some embodiments, a write pulse generator 635 may be used to generate write pulses having the optimal write current and the optimal pulse width. For each MRAM sub-array, write pulse generator 635 may generate a write pulse with the optimal write current value and the optimal pulse width determined for that MRAM sub-array. Thus, each of the plurality of MRAM sub-arrays 605A-605N may have a different write pulse.

In some embodiments, instead of solving Equation (VI) in the first cycle, the first cycle may start by solving Equation (VII). In such cases, the pulse width t in Equation (VII) may be fixed to a pre-determined value, and Equation (VII) may be solved for an optimal write current value. When Equation (VII) is solved before Equation VI, multiple cycles are not needed.

Thus, Equation (VII) may be solved to obtain the optimal current value, then Equation (VI) may be solved to obtain the optimal pulse width. No additional cycles are needed. By solving Equations (VII) and (VI) in this way, B values of optimal write current and B values of optimal pulse width may be obtained for a B-bit word.

In other embodiments, an upper-bound may be placed on the pulse width. The upper bound on the pulse width may be used to achieve a desired write speed performance. Without an upper bound on the pulse width, the optimal pulse width may be very large, which may negatively impact write performance. Further, without an upper bound on the pulse width, the optimal write current may be identical for each of the bit positions $\left(\text{e.g., } I = \dfrac{I}{I_{c0}} = 2\right)$, which may be undesirable. By setting an upper bound for the pulse width, non-identical optimal write currents for the various positions may be obtained using Equations (VI) and VII, as discussed above.

In other embodiments, instead of determining an optimal write current value and an optimal pulse width for one or more bit positions, either the write current or the pulse width may be fixed and the other variable may be optimized. For example, in some embodiments, the write current may be fixed to a pre-determined value and the pulse width may be optimized using Equation VI. When only the pulse width is optimized, the same write current value may be applied to each bit position, but non-uniform optimal pulse widths, computed using Equation VI, may be applied to one or more bit positions.

Similarly, in some embodiments, the pulse width may be fixed to a pre-determined value and the write current may be optimized using Equation VII. When only the write current is optimized, the same pulse width may be applied to each bit position and non-uniform optimal write current, as computed using Equation VII, may be applied to one or more bit positions.

Further, as indicated above, in some embodiments PSNR may be used as a fidelity metric instead of MSE. PSNR is inversely proportional to MSE:

$$\text{PSNR} = 10 \log_{10}((2^B - 1)^{2)/MSE}$$

Therefore, if PSNR is desired as the fidelity metric, then MSE may be computed as discussed herein and the PSNR may be computed from the MSE using the formulae above.

Thus, write pulse optimization system 630 determines optimal write current and/or optimal pulse width for one or more bits of a B-bit word to satisfy a given fidelity metric and resource metric. Further, the optimal write current and/or optimal pulse width for the one or more bit positions is based upon the relative importance of each bit position. In some embodiments, the MSB may be considered more important than the LSB. In such cases, the optimal write current may be higher and/or optimal pulse width of the MSB may be longer than the optimal write current and/or optimal pulse width of the LSB.

In other embodiments, the LSB may be considered more important than the MSB. In these cases, the optimal write current may be higher and/or optimal pulse width of the LSB may be longer than that of the MSB. In yet other embodiments, bit positions other than the LSB and MSB may be considered more important. In these cases, these bit positions may have a greater optimal write current and/or longer optimal pulse width than the LSB and MSB. Thus, the optimal write current and/or optimal pulse width for one or more bit positions may be based upon a bit position's relative importance in a B-bit word.

By selectively increasing the magnitude of the write current and/or making the pulse width longer based upon the relative bit positions, the write energy for only the more important bit positions is increased, and the overall write energy for writing the B-bit word is decreased. By setting the write energy as the resource metric constraint, the increase in the write energy may be capped to the value set by the resource metric constraint. Additionally, the WER is reduced.

Write pulse optimization system 630 may be configured to determine the relative importance of one or more of the bit positions. In some embodiments, the relative importance may be based upon the application. For example and as indicated above, in machine learning and signal processing applications, MSB is more important than LSB. In some embodiments, other designated criteria may be used to determine the relative importance of each bit position.

In some embodiments, memory controller 640 may provide an indication of the relative importance of each bit position to write pulse optimization system 630. Write pulse optimization system 630, interleaver 625, and write pulse generator 635 may be part of or associated with memory controller 640. In other embodiments, one or more of write pulse optimization system 630, interleaver 625, and write pulse generator 635 may be separate from the memory controller 640, and operationally associated therewith. Further, in some embodiments, one or more of write pulse optimization system 630, interleaver 625, and write pulse generator 635 may be integrated together into a single component, and the combined component may perform the functions of the individual components that have been combined.

One or more of write pulse optimization system 630, interleaver 625, and write pulse generator 635 may be configured as software, firmware, hardware, or combinations thereof. Although not shown, one or more of write pulse optimization system 630, interleaver 625, and write pulse generator 635 may have their own processing unit(s) and memory to store instructions that are executed by the respective processing unit(s). Memory controller 640 is analogous to memory controller 135.

Upon determining the optimal write current and/or optimal pulse width for one or more bit positions, write pulse optimization system 630 may provide the optimal write current and/or optimal pulse width values to write pulse generator 635. Write pulse generator 635 may then generate write pulses in accordance with the optimal write current and/or optimal pulse width values.

Specifically, write pulse generator 635 may apply a different optimal write current and/or optimal pulse width to each of the plurality of MRAM sub-arrays 605A-605N based upon the computed optimal write current and/or optimal pulse width for that bit position and the sub-array storing the bit corresponding to that bit position.

For example and as shown in FIG. 6, if the optimal pulse widths computed for an eight-bit word are t=(t0, t1, t2, t7) where t0 is the optimal pulse width for LSB and t7 is the optimal pulse width for MSB, and the optimal write currents for the eight-bit word are i=(i0, i1, i2, i7) where i0 is the optimal write current for LSB and i7 for MSB, write pulse generator 635 may generate a first write pulse for MRAM sub-array 605A with the t0 pulse width and the i0 write current, a second write pulse 650 for MRAM sub-array 605B with t1 pulse width and i1 write current, and so on.

Therefore, based upon the relative importance of a bit position, the optimal write current and/or optimal pulse width may vary. Further, in some embodiments, the granularity of the number of optimal write current and/or optimal pulse width may be controlled. For example and as discussed above, for a B-bit word, an optimal write current and/or optimal pulse width is computed for a bit position.

In some embodiments, a bit position may have a different value of the optimal write current and/or optimal pulse width relative to other bit positions, such that the granularity of the optimal write current and/or optimal pulse width for a B-bit word is B. In some embodiments, a lower granularity may be desired.

For example, it may be desired that the first four bits of an eight-bit word may have a first optimal write current and/or a first optimal pulse width while the last four bits of the eight-bit word have a second optimal write current and/or a second optimal pulse width. Thus, two different values of the optimal write current and/or two different values of optimal pulse width may be used, leading to a granularity of two for each of the optimal write current and the optimal pulse width.

Similarly, in some embodiments, a granularity of four may be used such that pairs of bits have the same optimal write current and/or optimal pulse width. If the same optimal write current and/or optimal pulse width is applied to each of the bit positions, then the granularity is one. In some embodiments, the granularity of the optimal write current may be same as the granularity of the optimal pulse width. In other embodiments, the granularities of the optimal write current and optimal pulse width may vary. Thus, the granularity of each of the optimal write current and optimal pulse width may vary between one and B for a B-bit word.

Additionally, regardless of the granularity that is used, the optimal write current and/or optimal pulse width that is computed for a bit position is still based upon the relative importance of the bit positions. For example, when a granularity of two is used such that half the bit positions have the first optimal write current and/or the first optimal pulse width and the other half have a second optimal write current and/or a second optimal pulse width, the values of the first optimal write current and/or the first optimal pulse width, as well as the second optimal write current and/or the second optimal pulse width are based upon the relative bit positions.

Specifically, the bit positions that are towards the MSB may have a greater optimal write current and/or a longer optimal pulse width compared to the bit positions that are towards the LSB. Thus, in an eight-bit word having a granularity of two, the four bits closest to the MSB may have a greater optimal write current and/or a longer optimal pulse width than the four bits closest to the LSB.

In some embodiments, the optimal write current and/or optimal pulse width that are used for the write pulses may be selected based upon the granularity that is desired. For example, for a B-bit word, the optimal write current and/or optimal pulse width may be computed for a bit position as discussed above. From these computed optimal write current and/or optimal pulse width, certain values may be selected based on the desired granularity.

For example, when the granularity is two, in some embodiments, the optimal write current and/or optimal pulse width for the LSB may be used for other bit positions as well that are closest to the LSB regardless of the optimal write current and/or optimal pulse width computed for those bit positions (e.g., if the computed optimal write current and/or optimal pulse width for those other bit positions varies from the optimal write current and/or optimal pulse width for the LSB, the optimal write current and/or optimal pulse width for the LSB may be used for those other bit positions as well). Similarly, the optimal write current and/or optimal pulse width for the MSB may be used for those half of the bit positions that are closest to the MSB regardless of the optimal write current and/or optimal pulse width computed for those other bit positions.

In some embodiments, optimal write current and/or optimal pulse width values for a bit position of a B-bit word may be computed before-hand for various combinations of fidelity metric, resource metric, and granularity, and stored in a look-up table of the write pulse optimization system 630. The inputs to the look-up table may be the desired fidelity metric, the desired resource metric, and/or the granularity, and the output may be the optimal write current and/or optimal pulse width for each bit position of a B-bit word.

For example, to minimize MSE and achieve a desired write energy, in some embodiments, the desired write energy constraint may be used as an input to the look-up table. The minimum MSE from all records in the look-up table having the desired write energy constraint may be selected. The write current and pulse width corresponding to the minimum MSE may then give the optimal write current and/or optimal pulse width of one or more bit positions of a B-bit word.

For an eight-bit word, the look-up table may output up to eight optimal refresh interval values, one for each of the eight bit positions. In other embodiments, the minimum MSE may be used as an input to the look-up table. From all records with the minimum MSE, the record corresponding to the desired write energy may be selected to output the optimal write current and/or optimal pulse width.

Similarly, in some embodiments, optimal write current and/or optimal pulse width may be obtained to minimize write energy and achieve a given MSE. An optimal write current and/or optimal write pulse width may then be obtained as follows:

Fix i, then solve $$t^* = \mathrm{argmin}_t E(i, t) \text{ subject to } MSE(i, t) \leq \mathcal{U}, 0 \leq t_b \leq \delta \quad \text{(VIII)}$$

$\mathcal{U}$=maximum allowable MSE (fidelity metric constraint).

Equation (VIII) may be solved using the ACS algorithm as discussed above or using any other algorithm that is considered suitable. Upon computing the optimal pulse width, t*, using Equation (VIII), the pulse width, t, may be fixed as t*, and an optimal write current, i*, may be computed as follows:

Fix t=t*, then solve:

$$i^* = \mathrm{argmin}_i E(i, t^*) \text{ subject to } MSE(i, t^*) \leq \mathcal{U}, 1 + \epsilon \leq i_b \quad \text{(IX)}$$

Equations (VIII) and (IX) may be solved repeatedly in a loop multiple times until a stopping criterion is reached, as discussed above. By solving and optimizing Equations (VIII) and (IX), an optimal write current and/or optimal pulse width may be obtained for a bit position. In some embodiments, Equation (IX) may be solved before Equation (VIII). In such cases, a single cycle of solving Equations (IX) and (VIII) may be sufficient to provide an optimal write current and/or optimal pulse width.

Further, when a look-up table is used, the MSE may be used an input to the look-up table. If multiple records are found for the MSE in the look-up table, the record with the minimum write energy value may be selected. The write current and/or the pulse width corresponding to that minimum write energy may then provide the optimal write current and/or optimal pulse width for a bit position of the B-bit word. In other embodiments, the record(s) with the minimum write energy may be selected. From those record(s), the record with the desired MSE may be selected to output the optimal write current and/or optimal pulse width.

In some embodiments, the granularity of the optimal write current and/or optimal pulse width also may be used as an input to determine the optimal write current and/or optimal pulse width. Thus, the look-up table may be structured in a variety of ways. In other embodiments, mechanisms other than a look-up table may be used to determine the optimal write current and/or optimal pulse width for each bit position.

Figure 7:
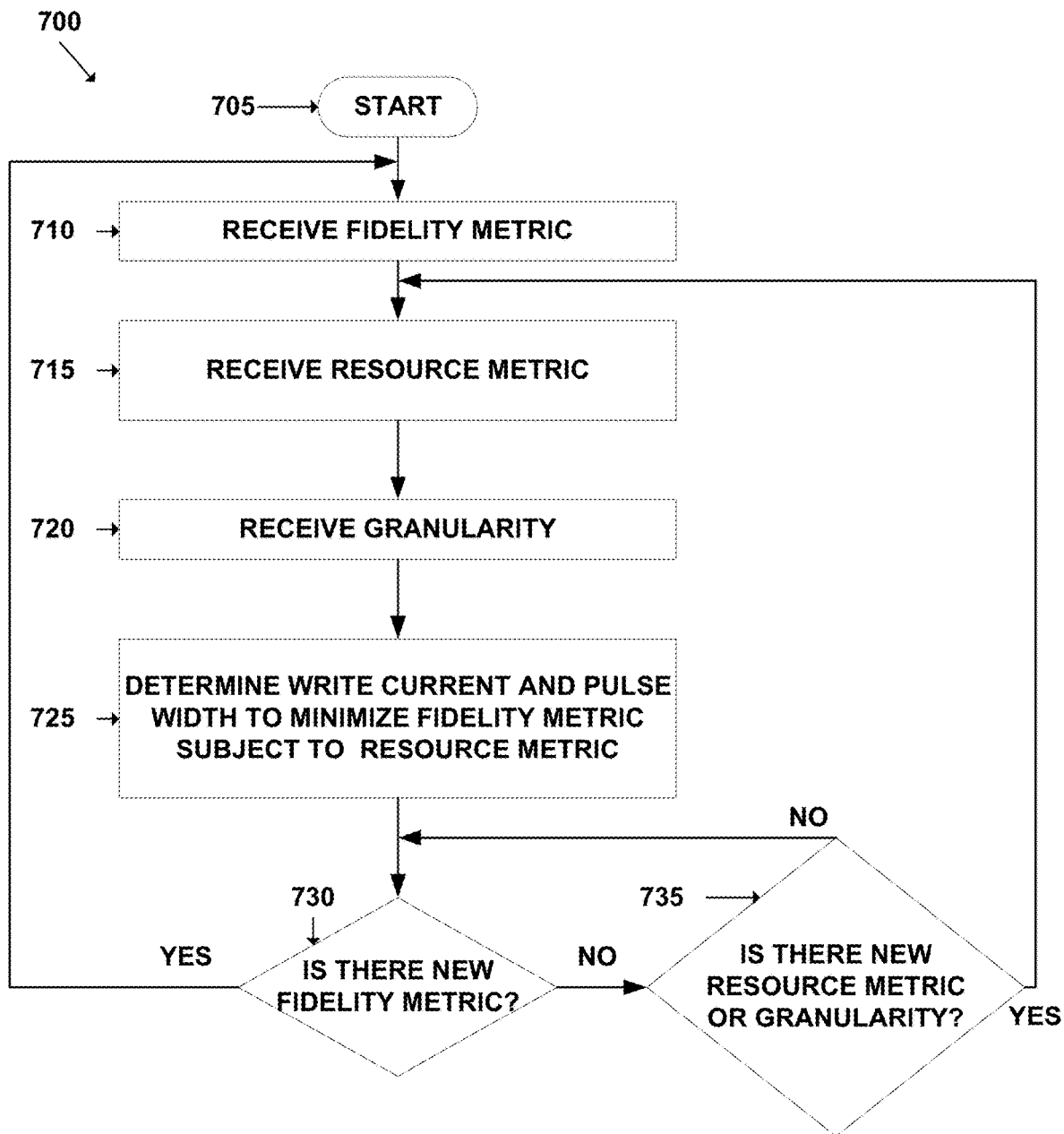
FIG. 7 is an example flowchart outlining operations for operating the MRAM array of FIGS. 5 and 6, in accordance with some embodiments of the present disclosure.

Referring to FIG. 7, an example flowchart outlining operations of a process 700 for generating write pulses based on relative importance of bit positions is shown, in accordance with some embodiments of the present disclosure. Process 700 may include additional or other operations depending upon the particular embodiment. Process 700 may be implemented by write pulse optimization system 630, interleaver 625, and write pulse generator 635 of memory controller 640.

Upon starting at operation 705, memory controller 640 receives an instruction (e.g., from host device 105) to store a B-bit word in MRAM array 600. Interleaver 625 stores each bit of the B-bit word in a separate one of the plurality of MRAM sub-arrays 605A-605N of MRAM array 600. Interleaver 625 knows which MRAM sub-array is configured for storing which bit position. Thus, interleaver 625 stores the MSB in the MRAM sub-array (e.g., MRAM sub-array 605N) configured to store MSB, stores the LSB in the MRAM sub-array (e.g., MRAM sub-array 605A) configured to store LSB, and stores the remaining bits in the MRAM sub-arrays configured to store the bit positions of the remaining bits.

At operation 710, write pulse optimization system 630 receives a fidelity metric. As discussed above, the fidelity metric may be BER, MSE, PSNR, etc., that define or are associated with error rates of writing data. In some embodiments, write pulse optimization system 630 may receive the fidelity metric from memory controller 640, which in turn may have received the fidelity metric from the host device 105. In other embodiments, write pulse optimization system 630 may receive the fidelity metric directly from host device 105 or from another component of the computing device with which the write pulse optimization system is associated.

At operation 715, write pulse optimization system 630 receives a resource metric. As discussed above, the resource metric may be write energy, write speed, etc. Write pulse optimization system 630 may receive the resource metric in a similar way as the fidelity metric. In other words, write pulse optimization system 630 may receive the resource metric from memory controller 640, host device 105, or any other component of the computing system with which the write pulse optimization system is associated.

At operation 720, write pulse optimization system 630 receives a granularity defining the number of values to be used for the optimal write current and/or the optimal pulse width. As discussed above, in some embodiments, each bit position of the B-bit word may have a different optimal write current and/or optimal pulse width. In such cases, the granularity is "B" for a B-bit word. In other embodiments, a smaller granularity may be used such that the same optimal write current and/or optimal pulse width may be used for multiple bit positions of a B-bit word.

Write pulse optimization system 630 may receive the granularity from memory controller 640, host device 105, or any other component of the computing system with which the write pulse optimization system is associated. Although process 700 has been described as receiving the fidelity metric before the resource metric, which is described as being received before the granularity, it is to be understood that the fidelity metric, resource metric, and granularity may be received in any order.

At operation 725, write pulse optimization system 630 computes an optimal write current and/or optimal pulse width for one or more bit positions of the B-bit word. In some embodiments, write pulse optimization system 630 may compute an optimal write current and optimal pulse width for each bit position. In other embodiments, write pulse optimization system 630 may compute the optimal write current and the optimal pulse width for a subset of the bit positions of the B-bit word.

Further, in some embodiments, write pulse optimization system 630 may first determine the relative importance of the various bit positions before computing their optimal write current and/or optimal pulse width. Further, write pulse optimization system 630 determines an optimal write current and/or optimal pulse width for one or more bit positions of the B-bit word. In some embodiments, write pulse optimization system 630 may determine both the optimal write current and the optimal pulse width for one or more bit positions of the B-bit word. In other embodiments, write pulse optimization system 630 may determine either the optimal write current or the optimal pulse width for one or more bit positions of the B-bit word.

For example, in some embodiments, write pulse optimization system 630 may compute the optimal write current for one or more bit positions of the B-bit word and use a pre-determined non-optimized pulse width for those bit positions. Similarly, in some embodiments, write pulse optimization system 630 may compute the optimal pulse width for one or more bit positions of the B-bit word and use a pre-determined non-optimized write current for those bit positions. Thus, depending upon the embodiment, write pulse optimization system 630 may optimize the write current, the pulse width, or both.

In some embodiments, upon receiving the fidelity metric, the resource metric, and the granularity, write pulse optimization system 630 may use a look-up table to determine the optimal write current and/or optimal pulse width, as discussed above. Write pulse optimization system 630 may continue to use the optimized write current and/or the optimized pulse width for writing data until a new fidelity metric is received at operation 730. Thus, at operation 730, write pulse optimization system 630 determines if a new fidelity metric is received. Write pulse optimization system 630 may check for a new fidelity metric periodically or upon satisfying predetermined conditions.

The new fidelity metric of operation 730 may be a different fidelity metric than the one received previously at operation 710 or the new fidelity metric may be a different value of the same metric received at operation 710. In other words, if the fidelity metric previously received at operation 710 is MSE, the new fidelity metric received at operation 730 may be PSNR or a different value of MSE. The new fidelity metric may be received in the same or similar way as the fidelity metric received at operation 710.

If a new fidelity metric is received at operation 730, process 700 loops back to operation 710 and repeats operations 710-725. If no new fidelity metric is received at operation 730, in some embodiments, write pulse optimization system 630 may determine if a new resource metric or granularity is received at operation 735. If no new resource metric and no new granularity is received at operation 735, write pulse optimization system 630 goes back to operation 730 and continues to monitor for updates to the fidelity metric.

If a new resource metric is received at operation 735, process 700 loops back to operation 715, as shown in FIG. 7, and repeats operation 715-725 using the fidelity metric that was previously received at operation 710. If a new granularity is received at operation 735, process 700 loops back to operation 720 (not shown in FIG. 7) and repeats operation 725 using the fidelity metric previously received at operation 710 and the resource metric previously received at operation 715.

Thus, process 700 provides a mechanism to dynamically, in substantially real-time, update the optimal write current and optimal pulse width values of each bit position of a B-bit word depending upon the relative importance of the bit positions, while achieving desired fidelity and resource metrics.

Figure 8:
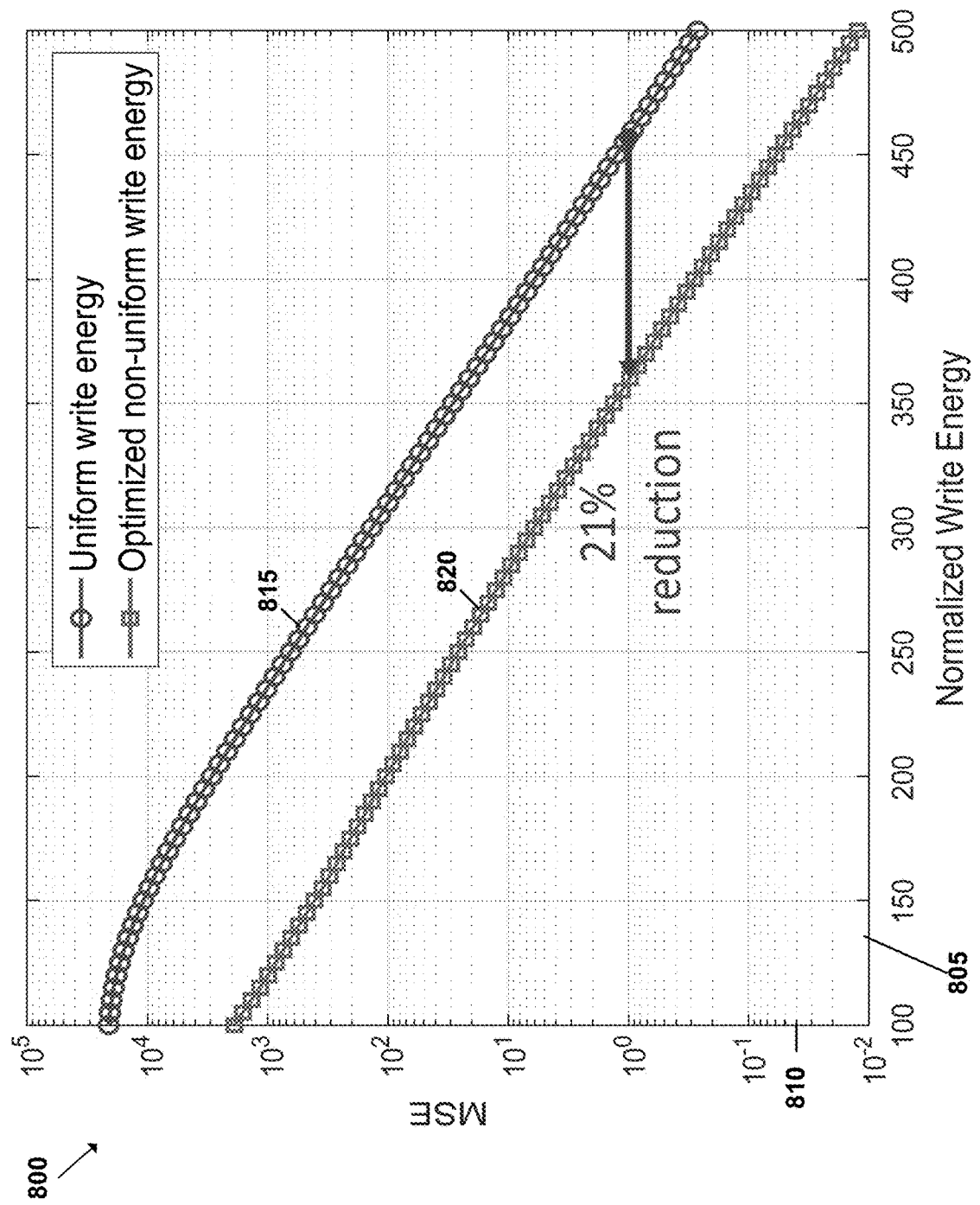
FIG. 8 is an example graph plotting a relationship between a fidelity metric and a write energy for a particular bit position of data stored in the MRAM array of FIG. 6, in accordance with some embodiments of the present disclosure.

Referring to FIG. 8, an example graph 800 comparing MSE and normalized write energy is shown, in accordance with some embodiments of the present disclosure. A lower MSE and lower write energy consumption are desirable. Graph 800 plots normalized write energy on X-axis 805 against MSE on Y-axis 810. Graph 800 also includes a first curve 815 that corresponds to write energy for a particular bit position obtained using conventional mechanisms and a second curve 820 that corresponds to write energy for the particular bit position obtained using the present disclosure.

Second curve 820 has a lower MSE and consumes lesser write energy compared to first curve 815. For example, at an MSE of one, the write energy of second curve 820 shows about a twenty one percent reduction compared to the write energy of first curve 815. Thus, the optimally computed write pulses of the present disclosure reduce errors in the bit positions, while conserving write energy.

Figure 9:
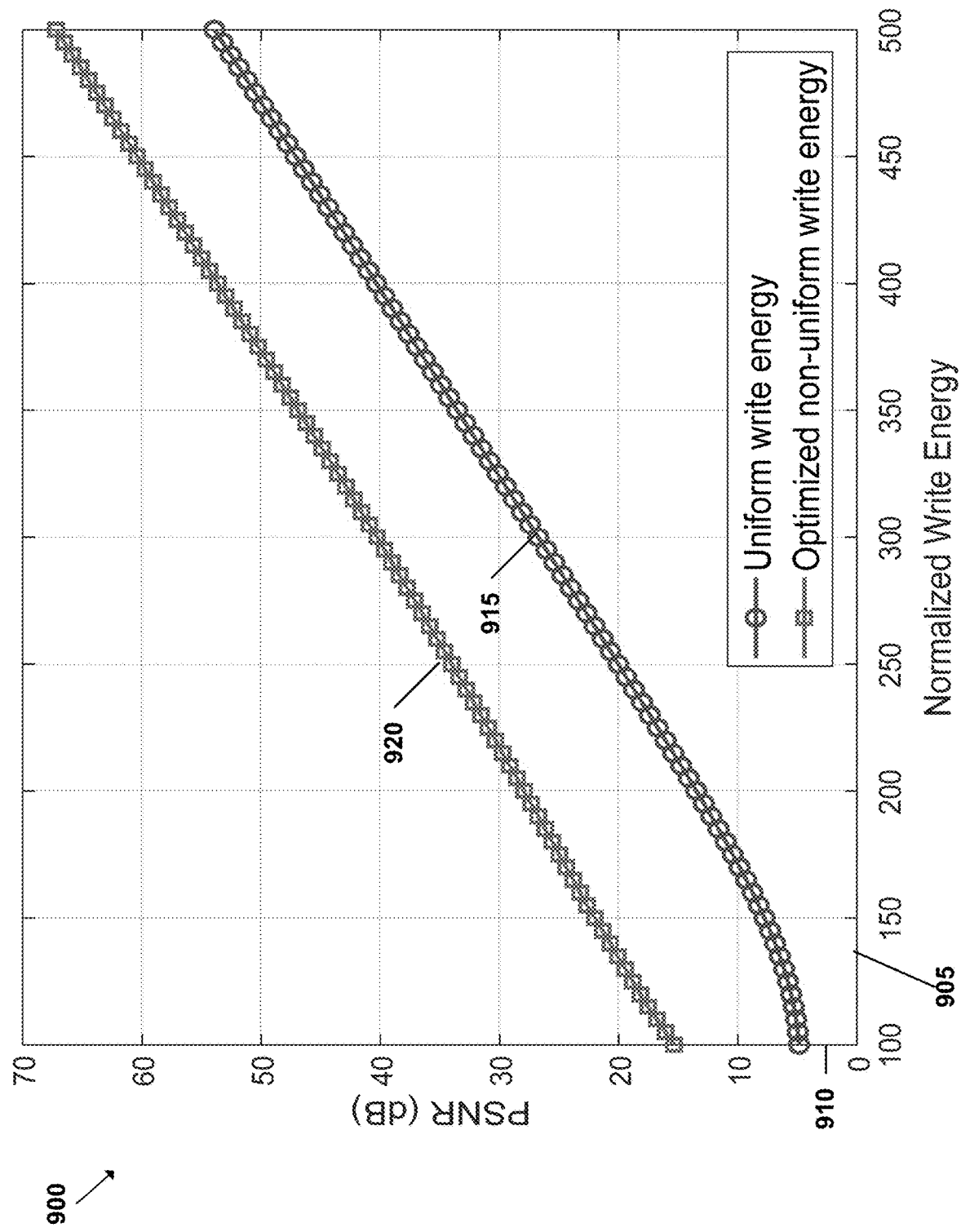
FIG. 9 is an example graph plotting the relationship between another fidelity metric and a write energy for a particular bit position of data stored in the MRAM array of FIG. 6, in accordance with some embodiments of the present disclosure.

Turning to FIG. 9, an example graph 900 comparing PSNR and normalized write energy is shown, in accordance with some embodiments of the present disclosure. A higher PSNR and lower write energy consumption are desirable. Graph 900 plots normalized write energy on X-axis 905 against PSNR on Y-axis 910. Graph 900 also includes a first curve 915 that corresponds to write energy for a particular bit position obtained using conventional mechanisms and a second curve 920 that corresponds to write energy for the particular bit position obtained using the present disclosure. Second curve 920 has a higher PSNR and consumes lesser write energy compared to first curve 915.

Figure 10:
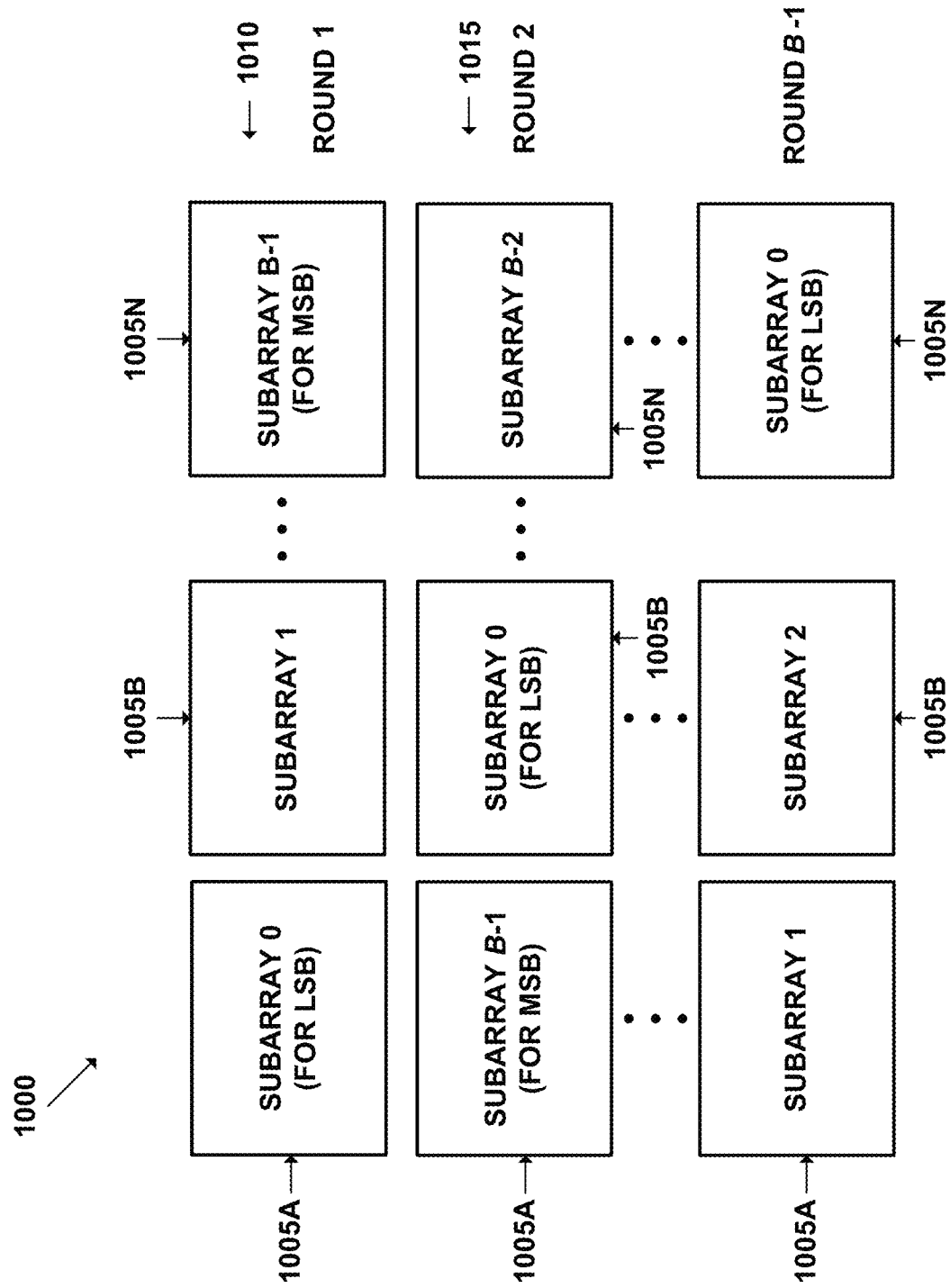
FIG. 10 is an example block diagram showing a wear-levelling operation, in accordance with some embodiments of the present disclosure.

Turning now to FIG. 10, an example block diagram showing a wear-leveling operation 1000 is shown, in accordance with some embodiments of the present disclosure. As discussed above, each bit of a B-bit word is stored in a different sub-array of an MRAM module. As also discussed above, the MRAM sub-arrays that store bits with more important bit positions (e.g., MSB) have higher write energy (e.g., higher current and/or longer pulse width) than the MRAM sub-arrays that store bits with less important bit positions (e.g., LSB). The MRAM sub-arrays that use the higher write energy may suffer greater wear than the MRAM sub-arrays that use a lower write energy. To somewhat equalize wear on the MRAM sub-arrays, in some embodiments, the interleaver (e.g., interleaver 625) may apply the wear-leveling operation 1000.

In wear-leveling operation 1000, the bit positions that are stored in MRAM sub-arrays 1005A-1005N may be rotated such that each MRAM sub-array goes through periods of having a higher write energy (e.g., when storing MSB) and lower write energy (e.g., when storing LSB). Specifically, as shown in FIG. 10, in a first round 1010, MRAM sub-array 1005A may store the LSB and sub-array 1005N may store the MSB.

Thus, during first round 1010, MRAM sub-array 1005N has a higher write energy than MRAM sub-array 1005A. In a second round 1015, the bit positions may be shifted by one step such that MRAM sub-array 1005A now stores the MSB and the MRAM sub-array 1005B now stores the LSB, and so on.

Thus, during second round 1015, MRAM sub-array 1005A has a higher write energy than MRAM sub-array 1205B and sub-array 1205N. Although the shifting is shown to be one step to the right, in other embodiments, the shifting may be one step to the left or may shift multiple steps.

Thus, by performing wear-leveling operation 1200, the wear on sub-arrays 1205A-1205N may be equalized. The switching from first round 1210 to second round 1210 may occur when certain pre-determined conditions are satisfied. For example, in some embodiments, the switching of the rounds may occur after a designated number of writing operations have been performed. In other embodiments, the switching may occur after a pre-determined time period has passed, etc.

Although the present disclosure focusses on MRAM, the systems and methods disclosed herein can be applicable to any memory that utilizes write pulses to write data to a memory cell. Further, in some embodiments, and particularly for memories that store more than one bit of information (e.g., are configured as multi-level cells), gray mapping may be used along with the optimal write current and optimal pulse widths discussed herein.

Depending on the embodiment, certain acts, events, or functions of any of the processes or algorithms described herein can be performed in a different sequence, can be added, merged, or left out altogether (e.g., not all described operations or events are necessary for the practice of the algorithm). Moreover, in certain embodiments, operations or events can be performed concurrently, e.g., through multi-threaded processing, interrupt processing, or multiple processors or processor cores or on other parallel architectures, rather than sequentially.

The various illustrative logical blocks, modules, routines, and algorithm steps described in connection with the embodiments disclosed herein can be implemented as electronic hardware, or combinations of electronic hardware and computer software. To clearly illustrate this interchangeability, various illustrative components, blocks, modules, and steps have been described above generally in terms of their functionality.

Whether such functionality is implemented as hardware, or as software that runs on hardware, depends upon the particular application and design constraints imposed on the overall system. The described functionality can be implemented in varying ways for each particular application, but such implementation decisions should not be interpreted as causing a departure from the scope of the disclosure.

Moreover, the various illustrative logical blocks and modules described in connection with the embodiments disclosed herein can be implemented or performed by a machine, such as a general purpose processor device, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein.

A control processor can synthesize a model for an FPGA. For example, the control processor can synthesize a model for logical programmable gates to implement a tensor array and/or a pixel array. The control channel can synthesize a model to connect the tensor array and/or pixel array on an FPGA, a reconfigurable chip and/or die, and/or the like.

A general purpose processor device can be a microprocessor, but in the alternative, the processor device can be a controller, microcontroller, or state machine, combinations of the same, or the like. A processor device can include electrical circuitry configured to process computer-executable instructions. In another embodiment, a processor device includes an FPGA or other programmable device that performs logic operations without processing computer-executable instructions.

A processor device also can be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor device also may include primarily analog components.

For example, some or all of the algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, routine, or algorithm described in connection with the embodiments disclosed herein can be embodied directly in hardware, in a software module executed by a processor device, or in a combination of the two. A software module can reside in RAM memory, flash memory, ROM memory, EPROM memory, EEPROM memory, registers, hard disk, a removable disk, a CD-ROM, or any other form of a non-transitory computer-readable storage medium.

An exemplary storage medium can be coupled to the processor device such that the processor device can read information from, and write information to, the storage medium. In the alternative, the storage medium can be integral to the processor device. The processor device and the storage medium can reside in an ASIC. The ASIC can reside in a user terminal. In the alternative, the processor device and the storage medium can reside as discrete components in a user terminal.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps.

Thus, such conditional language is not generally intended to imply that features, elements and/or steps are in any way required for one or more embodiments or that one or more embodiments necessarily include logic for deciding, with or without other input or prompting, whether these features, elements and/or steps are included or are to be performed in any particular embodiment.

The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Although the above detailed description has shown, described, and pointed out novel features as applied to various embodiments, it can be understood that various omissions, substitutions, and changes in the form and details of the devices or algorithms illustrated can be made without departing from the spirit of the disclosure. As can be recognized, certain embodiments described herein can be embodied within a form that does not provide all of the features and benefits set forth herein, as some features can be used or practiced separately from others.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved.

Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present.

For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances, where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.).

It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

The invention claimed is:

1. An apparatus comprising:
a memory device comprising a plurality of sub-arrays; and
a memory controller configured to:
determine a value of a parameter of a corresponding write pulse for each bit of a word based on a relative importance of each bit; and
simultaneously write each bit of the word to a corresponding one of the plurality of sub-arrays using the corresponding write pulses.

2. The apparatus of claim 1, wherein the memory controller is configured to determine the value of the parameter of the corresponding write pulse by minimizing a fidelity metric while satisfying a resource metric.

3. The apparatus of claim 2, wherein the fidelity metric comprises at least one of a mean square error and a peak signal-to-noise ratio, and wherein the resource metric comprises a write energy.

4. The apparatus of claim 1, wherein the parameter of the corresponding write pulse comprises at least one of a write current, a pulse width, or a write voltage.

5. The apparatus of claim 1, wherein a most significant bit of the word has a higher relative importance than a least significant bit of the word.

6. The apparatus of claim 1, wherein the value of the parameter of the corresponding write pulse of a most significant bit of the word is greater than the value of the parameter of the corresponding write pulse of a least significant bit of the word.

7. The apparatus of claim 1, wherein the parameter of the corresponding write pulse comprises a write current, and wherein a bit position that is of greater relative importance is assigned a greater write current than a bit position that is of lesser relative importance.

8. The apparatus of claim 1, wherein the parameter of the corresponding write pulse comprises a pulse width, and wherein a bit position that is of greater relative importance is assigned a greater pulse width than a bit position that is of lesser relative importance.

9. The apparatus of claim 1, memory controller is further configured to determine the value of the parameter of the corresponding write pulse to satisfy a granularity.

10. A method comprising:
determining by a memory controller a value of a parameter of a corresponding write pulse for each bit of a word based on bit position within the word; and
simultaneously writing by the memory controller each bit of the word to a memory device using the corresponding write pulse for each bit,
wherein determining comprises determining the value of the parameter of the corresponding write pulse based on a relative importance of a bit position of each bit of the word.

11. The method of claim 10, wherein determining the value of the parameter of the corresponding write pulse comprises minimizing a fidelity metric while satisfying a resource metric.

12. The method of claim 11, wherein the fidelity metric comprises at least one of a mean square error and a peak signal-to-noise ratio, and wherein the resource metric comprises a write energy.

13. The method of claim 10, wherein the parameter of the corresponding write pulse comprises at least one of a write current, a pulse width, or a write voltage.

14. The method of claim 10, further comprising determining by the memory controller the value of the parameter of the corresponding write pulse to satisfy a granularity.

15. The method of claim 10, wherein the word the parameter of the corresponding write pulse comprises a pulse width, and wherein a bit position that is of greater relative importance is assigned a greater pulse width than a bit position that is of lesser relative importance.

16. The method of claim 10, wherein a most significant bit of the word has a higher relative importance than a least significant bit of the word.

17. The method of claim 10, wherein the value of the parameter of the corresponding write pulse of a most significant bit of the word is greater than the value of the parameter of the corresponding write pulse of a least significant bit of the word.

18. The method of claim 10, wherein the parameter of the corresponding write pulse comprises a write current, and wherein a bit position that is of greater relative importance is assigned a greater write current than a bit position that is of lesser relative importance.

19. An apparatus comprising:
a memory device comprising a first sub-array and a second sub-array; and
a memory controller configured to:
simultaneously write a first bit of a first word to the first sub-array using a first write pulse comprising a first write energy and write a second bit of the first word to the second sub-array using a second write pulse comprising a second write energy lower than the first write energy; and simultaneously write a first bit of a second word to the second sub-array using a third write pulse that comprises a third write energy higher than the second write energy and write a second bit of the second word to the first sub-array using a fourth write pulse that comprises a fourth write energy lower than the first write energy.

20. The apparatus of claim 19, wherein the first bit of the first word has a higher relative importance to the second bit of the first word, and the first bit of the second word has a higher relative importance to the second bit of the second word.

\* \* \* \* \*